(12) United States Patent
Yoshihara

(10) Patent No.: US 10,485,139 B2
(45) Date of Patent: Nov. 19, 2019

(54) POWER MODULE, THERMAL DISSIPATION STRUCTURE OF THE POWER MODULE AND CONTACT METHOD OF THE POWER MODULE

(71) Applicant: ROHM CO., LTD., Kyoto-shi, Kyoto (JP)

(72) Inventor: Katsuhiko Yoshihara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/885,050

(22) Filed: Jan. 31, 2018

(65) Prior Publication Data

US 2018/0160569 A1 Jun. 7, 2018

Related U.S. Application Data

(63) Continuation of application No. PCT/JP2016/073951, filed on Aug. 17, 2016.

(30) Foreign Application Priority Data

Sep. 1, 2015 (JP) ................................ 2015-171799

(51) Int. Cl.
*H05K 7/20* (2006.01)
*H01L 23/36* (2006.01)
(Continued)

(52) U.S. Cl.
CPC ......... *H05K 7/20509* (2013.01); *H01L 23/10* (2013.01); *H01L 23/3107* (2013.01);
(Continued)

(58) Field of Classification Search
CPC ...................................................... H01L 23/36
(Continued)

(56) References Cited

U.S. PATENT DOCUMENTS

| 5,586,005 A | 12/1996 | Cipolla et al. |
| 2005/0174738 A1* | 8/2005 | Lam ........................ H01L 23/36 361/704 |

(Continued)

FOREIGN PATENT DOCUMENTS

| JP | S62-160540 U | 10/1987 |
| JP | H08-264690 A | 10/1996 |

(Continued)

OTHER PUBLICATIONS

International Search Report and Written Opinion, International Patent Application No. PCT/JP2016/073951, dated Oct. 11, 2016, with English translation of Search Report (8 pages).

*Primary Examiner* — Mukundbhai G Patel
(74) *Attorney, Agent, or Firm* — Hamre, Schumann, Mueller & Larson, P.C.

(57) ABSTRACT

The power module in which a plurality of switching elements connected in series between a first and second power terminals and a circuit configured to connect connecting points thereof to an output terminal are formed, the power module includes: a heat sink to which the switching elements are contacted; a package configured to seal a perimeter of the plurality of switching elements and a part of each terminal so as to expose at least one portion of the heat sink; and a protruding portion for thickness control configured to regulate a thickness of a thermally-conductive material when contacting the heat sink to the cooling apparatus facing the cooling apparatus via the thermally-conductive material, wherein each terminal is exposed from opposite side surfaces of the package, the opposite side surfaces having a height different from a height of an exposed surface of the cooling apparatus of the package.

26 Claims, 19 Drawing Sheets

(51) Int. Cl.
*H01L 23/40* (2006.01)
*H01L 23/10* (2006.01)
*H01L 23/495* (2006.01)
*H05K 7/02* (2006.01)
*H01L 23/31* (2006.01)
*H01L 29/78* (2006.01)
*H01L 29/739* (2006.01)
*H01L 29/16* (2006.01)
*H01L 29/20* (2006.01)

(52) U.S. Cl.
CPC .............. *H01L 23/36* (2013.01); *H01L 23/40* (2013.01); *H01L 23/49562* (2013.01); *H01L 23/49568* (2013.01); *H01L 23/49575* (2013.01); *H01L 23/49586* (2013.01); *H01L 29/1608* (2013.01); *H01L 29/7395* (2013.01); *H01L 29/7802* (2013.01); *H01L 29/7813* (2013.01); *H05K 7/026* (2013.01); *H05K 7/209* (2013.01); *H01L 29/2003* (2013.01)

(58) Field of Classification Search
USPC .......................................... 257/707; 361/717
See application file for complete search history.

(56) References Cited

U.S. PATENT DOCUMENTS

| | | | | |
|---|---|---|---|---|
| 2010/0134979 | A1* | 6/2010 | Obiraki | H01L 23/3735 361/709 |
| 2012/0188712 | A1* | 7/2012 | Ishibashi | H02M 7/003 361/688 |
| 2014/0159054 | A1* | 6/2014 | Otake | H01L 23/48 257/77 |
| 2014/0293548 | A1* | 10/2014 | Besshi | H01L 23/3107 361/715 |
| 2015/0029673 | A1* | 1/2015 | Kadoike | H05K 7/20454 361/720 |

FOREIGN PATENT DOCUMENTS

| | | |
|---|---|---|
| JP | 2006-19599 A | 1/2006 |
| JP | 2006-32711 A | 2/2006 |
| JP | 2006-245434 A | 9/2006 |
| JP | 2011-172483 A | 9/2011 |
| JP | 2014-154571 A | 8/2014 |

* cited by examiner

POWER MODULE, THERMAL DISSIPATION STRUCTURE OF THE POWER MODULE AND CONTACT METHOD OF THE POWER MODULE

CROSS REFERENCE TO RELATED APPLICATIONS

This is a continuation application (CA) of PCT Application No. PCT/JP2016/073951, filed on Aug. 17, 2016, which claims priority to Japan Patent Application No. P2015-171799 filed on Sep. 1, 2015 and is based upon and claims the benefit of priority from prior Japanese Patent Applications No. P2015-171799 filed on Sep. 1, 2015 and PCT Application No. PCT/JP2016/073951, filed on Aug. 17, 2016, the entire contents of each of which are incorporated herein by reference.

FIELD

The embodiments described herein relate to a power module, a thermal dissipation structure of such a power module, and a contact method of such a power module.

BACKGROUND

Conventionally, there have been known power modules in which a power chip including a semiconductor device such as Insulated Gate Bipolar Transistor (IGBT) is mounted on a leadframe therein, and of which the whole system thereof is molded with resin, as one of semiconductor modules. Since such a semiconductor device produces heat during an operating state, it is common to dispose a heat sink via an insulating layer on a back side surface of the leadframe in order to cool the semiconductor device.

Moreover, there has also been known a thermal dissipation structure of contacting a heat sink to a cooling apparatus in order to improve cooling performance.

SUMMARY

The embodiments provide: a reliable power module capable of securing sufficient cooling performance and capable of suppressing degradation due to overheating; a thermal dissipation structure of such a power module; and a contact method of such a power module.

According to one aspect of the embodiments, there is provided a power module in which a plurality of switching elements connected in series between a first power terminal and a second power terminal and a circuit configured to connect connecting points thereof to an output terminal are formed, the power module comprising: a heat radiation plate to which the switching elements are contacted; a sealing body configured to seal a perimeter of the plurality of switching elements and a part of each terminal so as to expose at least one portion of the heat radiation plate; and a regulating portion formed on the sealing body, the regulating portion configured to regulate a thickness of a thermally-conductive material when contacting the heat radiation plate to a cooling plate facing the heat radiation plate via the thermally-conductive material, wherein each terminal is exposed from opposite side surfaces of the sealing body, the opposite side surfaces having a height different from a height of an exposed surface of the heat radiation plate of the sealing body.

According to another aspect of the embodiments, there is provided a thermal dissipation structure of a power module, the thermal dissipation structure comprising: a semiconductor device; a heat radiation plate to which the semiconductor device is contacted; a sealing body configured to seal a perimeter of the semiconductor device so as to expose at least one portion of the heat radiation plate; a plurality of terminals connected to an electrode of the semiconductor device, the plurality of the terminals exposed from opposite side surfaces of the sealing body, the opposite side surfaces having a height different from a height of an exposed surface of the heat radiation plate of the sealing body; a cooling plate to which the heat radiation plate exposed from the sealing body is contacted via a thermally-conductive material, the cooling plate facing the heat radiation plate; and a regulating portion formed on the sealing body, the regulating portion configured to regulate a thickness of the thermally-conductive material so as to become uniform, wherein the regulating portion is a square-shaped or circle-shaped convex region which is disposed so as to surround a periphery of the heat radiation plate, the convex region is configured to form a spatial area to be embedded with a predetermined quantity of the thermally-conductive material on the exposed surface of the heat radiation plate, and the convex region comprising a discharge groove configured to discharge the thermally-conductive material which becomes excessive in the spatial area to an outside of the spatial area.

According to still another aspect of the embodiments, there is provided a contact method of a power module for contacting the power module to a cooling plate so as to face to a heat radiation plate via a thermally-conductive material, the power module comprising: a semiconductor device; the heat radiation plate to which the semiconductor device is contacted; a sealing body configured to seal a perimeter of the semiconductor device so as to expose at least one portion of the heat radiation plate; and a plurality of terminals connected to an electrode of the semiconductor device, the plurality of the terminals exposed from opposite side surfaces of the sealing body, the opposite side surfaces having a height different from a height of an exposed surface of the heat radiation plate of the sealing body, the contact method comprising: forming a spatial area to be embedded with a predetermined quantity of the thermally-conductive material on an exposed surface of the heat radiation plate by a regulating portion including a square-shaped or circle-shaped convex region disposed so as to surround a periphery of the heat radiation plate, and discharged the thermally-conductive material which becomes excessive in the spatial area from a discharge groove formed on the convex region to an outside of the spatial area; and regulating a thickness of the thermally-conductive material so as to become uniform by a regulating portion when connecting of the power module, the regulating portion being formed on the sealing body or formed as a portion of the sealing body.

According to the embodiments, there can be provided the reliable power module capable of securing sufficient cooling performance and capable of suppressing degradation due to overheating; the thermal dissipation structure of such a power module; and the contact method of such a power module.

DESCRIPTION OF EMBODIMENTS

Figure 1A:
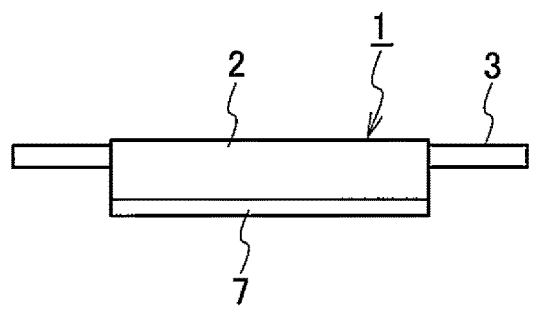
FIG. 1A is a schematic structure diagram of a power module according to a comparative example, which is a side view diagram of the power module.

Next, certain embodiments will now be described with reference to drawings. In the description of the following drawings, the identical or similar reference numeral is attached to the identical or similar part. However, it should be noted that the drawings, such as a top view diagram, a side view diagram, a bottom view diagram, a cross-sectional diagram, are merely schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

Comparative Example

Figure 1B:
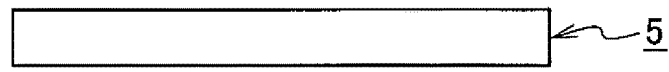
FIG. 1B is a schematic structure diagram of the power module according to the comparative example, which is a side view diagram of a cooling apparatus.

FIG. 1A shows a side surface structure of a power module 1 according to a comparative example, and FIG. 1B shows a side surface structure of a cooling apparatus 5 to be contacted to the power module shown in FIG. 1A. Moreover, a state of contacting the power module to the cooling apparatus is expressed as shown in FIG. 1C or FIG. 1D.

For example, in the power module 1 according to the comparative example, as shown in FIG. 1A, a perimeter of a semiconductor chip (not shown) is molded with a package 2, except for a portion of a lead terminal 3.

In the power module 1, as shown in FIG. 1B, a heat sink (not shown) positioned on a back side surface of the semiconductor chip is contacted to the cooling apparatus 5, in order to cool the semiconductor chip. At this time, the heat sink is contacted to the cooling apparatuses 5 via a thermally-conductive material 7.

Figure 1C:
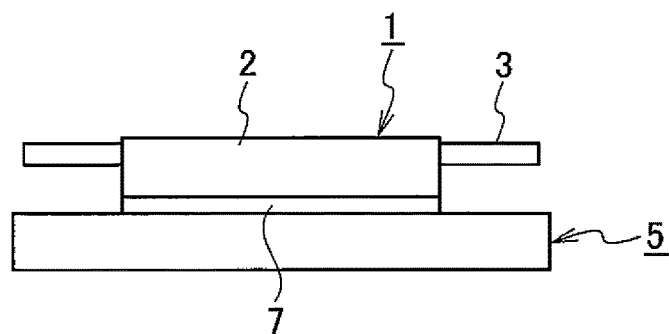
FIG. 1C is a schematic structure diagram of the power module according to the comparative example, which is a side view diagram showing a thermal dissipation structure (contacting state) of the power module.
Figure 1D:
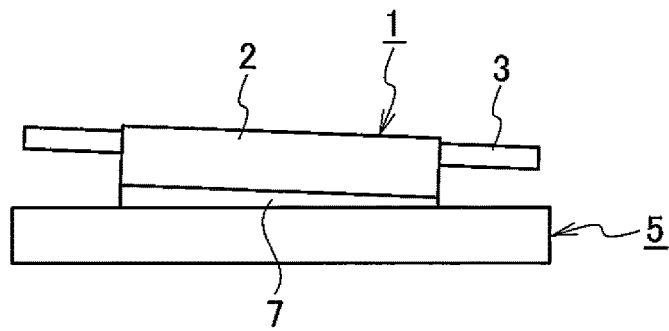
FIG. 1D is a schematic structure diagram of the power module according to the comparative example, which is a side view diagram for explaining the thermal dissipation structure of the power module.

More specifically, as shown in FIG. 1C, efficient thermal conduction can be realized by uniformly filling air gaps between the heat sink and the cooling apparatus 5 with the thermally-conductive material 7.

However, as a thermal dissipation structure of the power module 1, when the thermally-conductive material 7 is applied to a contact surface of the heat sink exposed from a bottom surface of the package 2 and then the heat sink is contacted to the cooling apparatus 5 via the thermally-conductive material 7, if a thickness of the thermally-conductive material 7 becomes uneven due to an unbalance of a quantity of the applied material of the thermally-conductive material 7 or an unbalance of pressurization at the time of contacting, as shown in FIG. 1D, cooling performance is reduced and the chip is broken down by overheating, and thereby damaging reliability of the power module 1.

First Embodiment (Configuration of Power Module)

Figure 2A:
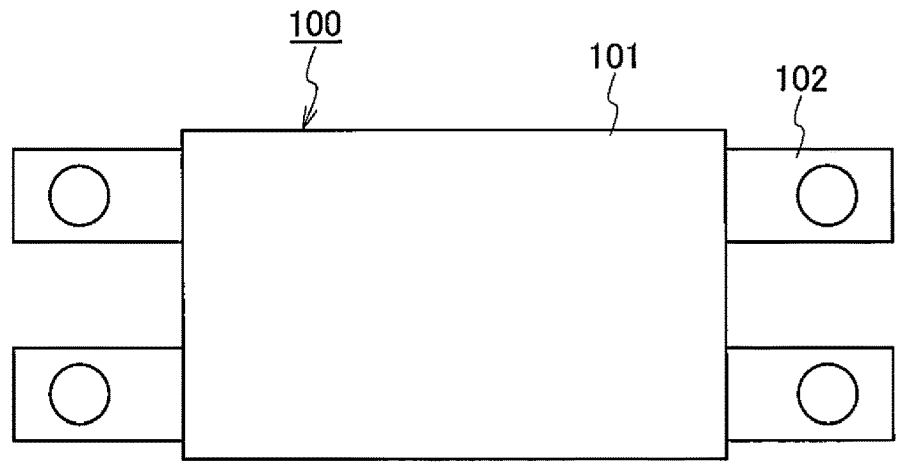
FIG. 2A is a schematic structure diagram of a power module according to the first embodiment, which is a top view diagram of the power module.
Figure 2B:
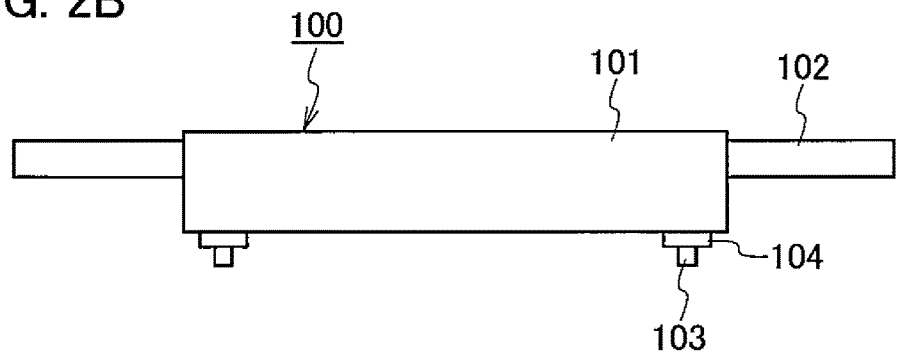
FIG. 2B is a schematic structure diagram of the power module according to the first embodiment, which is a side view diagram of the power module.
Figure 2C:
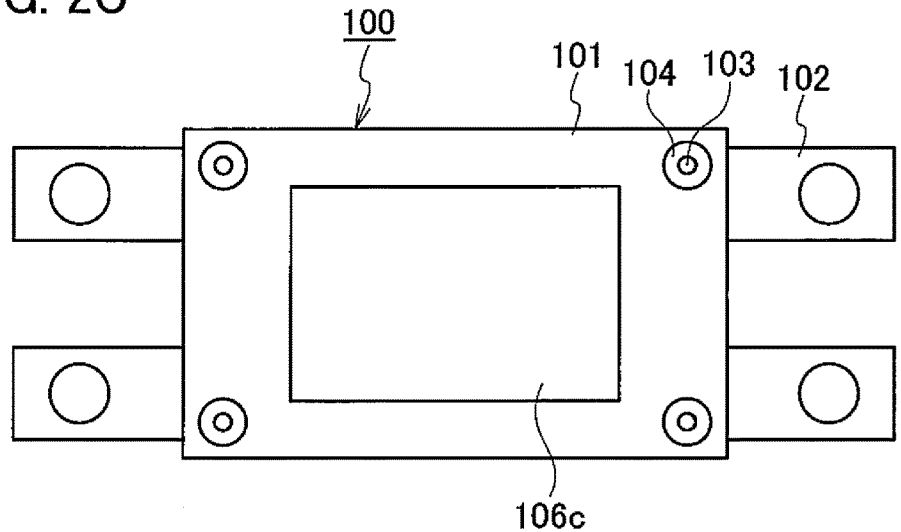
FIG. 2C is a schematic structure diagram of the power module according to the first embodiment, which is a bottom view diagram of the power module.

FIG. 2A shows a planar structure of a power module 100 according to the first embodiment, FIG. 2B shows a side surface structure of the power module 100, and FIG. 2C shows a bottom surface structure of the power module 100.

In the power module 100 according to the first embodiment, as shown in FIGS. 2A to 2C, a perimeter of a semiconductor chip (semiconductor device) which is not shown is molded with a package (sealing body) 101, except for a lead terminal 102 configured to extend to a side surface direction.

Moreover, as shown in FIG. 2C, a surface of a heat sink (heat radiation plate) 106c, which mounts a semiconductor chip, for example, to be contacted to the cooling apparatus (cooling plate) 110 to be mentioned below is substantially extensively exposed from a bottom surface of the package 101, in the power module 100. However, it may be configured so that at least a portion of the heat sink 106c is only exposed therefrom.

Moreover, in the power module 100, as shown in FIGS. 2B and 2C, a protruding portion 103 for positioning and a protruding portion 104 (convex region) for thickness control are formed at a periphery (e.g., each of four corners) at the exposed surface (contact surface) side of the heat sink 106c exposed from the bottom surface of the package 101 facing to the cooling apparatus 110. The protruding portion 103 for positioning is disposed so as to pass through a substantially center portion of the protruding portion 104 for thickness control. Alternatively, the protruding portion 104 for thickness control is disposed in doughnut shape so as to surround an outer periphery of the protruding portion 103 for positioning.

The protruding portion 103 for positioning has a convex shape to be attached to a concave region (not shown) previously prepared for the cooling apparatus 110 when the heat sink 106c is contacted to the cooling apparatus 110, and thereby positioning with respect to the cooling apparatus 110 of the power module 100 is performed by using the protruding portion 103 for positioning as a guide.

Figure 3A:
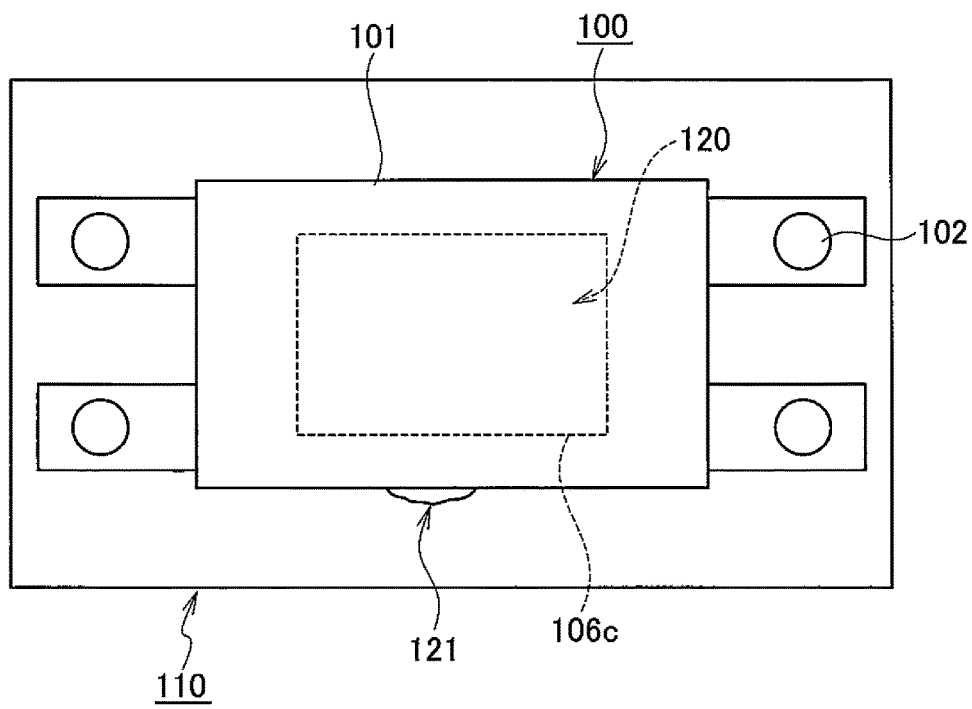
FIG. 3A is a top view diagram showing a state of contacting the power module according to the first embodiment to the cooling apparatus (thermal dissipation structure).
Figure 3B:
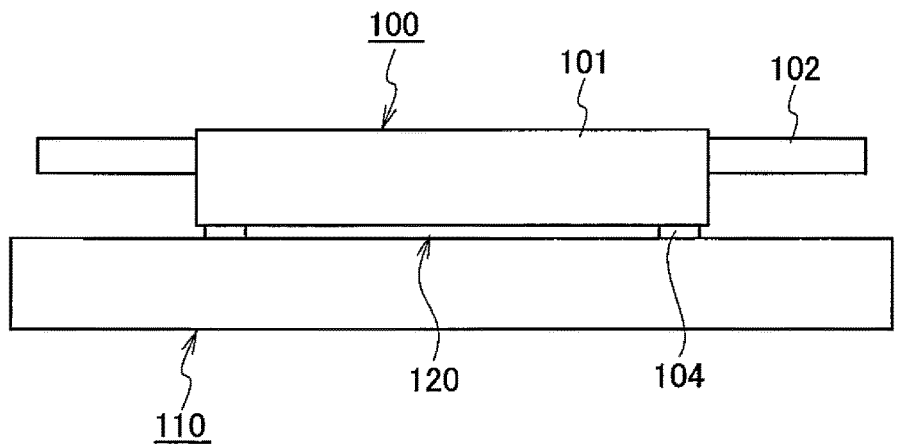
FIG. 3B is a side view diagram of FIG. 3A.

The protruding portion 104 for thickness control is functioned as a regulating portion for regulating a thickness of the thermally-conductive material 120 when contacting the heat sink 106c to the cooling apparatus 110 via the thermally-conductive material 120, and thereby the thickness of the thermally-conductive material 120 is controlled in accordance with the height (thickness) of the protruding portion 104, as shown in FIGS. 3A and 3B. The protruding portion 104 for thickness control has a substantially cylindrical shape (doughnut shape) so as to surround the outer periphery of the protruding portion 103 for positioning. The thickness of the protruding portion 104 is within a range from approximately 0.1 mm to approximately 1.0 mm, for example.

The protruding portion 104 for thickness control is configured so that a spatial area for interposing a predetermined quantity of the thermally-conductive material 120 between the heat sink 106c and the cooling apparatus 110 is virtually formed on the basis of the thickness thereof. More specifically, the three-dimensional area enclosed by the protruding portion 104 for thickness control disposed in each of the four corners is used as a virtual spatial area for interposing a predetermined quantity of the thermally-conductive material 120 between the heat sink 106c and the cooling apparatus 110. In this context, the predetermined quantity of the thermally-conductive material 120 corresponds to a quantity of the thermally-conductive material 120 required for filling an inside of the spatial area in a uniform height without air gap forming.

More specifically, the power module 100 according to the first embodiment includes: a heat sink 106c to which a semiconductor chip (not shown) is contacted; a package 101 configured to seal a perimeter of the semiconductor chip so as to expose at least one portion of the heat sink 106c; and a protruding portion 104 for thickness control configured to regulate a thickness of a thermally-conductive material 120 when contacting the heat sink 106c to the cooling apparatus 110 via the thermally-conductive material 120.

According to the configuration of the power module 100 according to the first embodiment, since the distance between the heat sink 106c and the cooling apparatus 110 (i.e., thickness of the thermally-conductive material 120) at the time of contacting the heat sink 106c to the cooling apparatus 110 can be controlled in accordance with the thickness of the protruding portion 104 for thickness control, the thickness of the thermally-conductive material 120 can be easily prevented from becoming uneven due to a variation in a quantity of the applied material of the thermally-conductive material 120, an unbalance of pressurization at the time of connecting, etc.

(Thermal Dissipation Structure/Contact Method)

FIGS. 3A and 3B show a thermal dissipation structure of contacting a power module 100 according to the first embodiment to the cooling apparatus 110.

More specifically, as shown in FIGS. 3A and 3B, a quantity which is a little larger than the predetermined quantity of the thermally-conductive material 120 is applied to the exposed bottom surface facing to the cooling apparatus 110 of the package 101 at a back surface side of the heat sink 106c on which the semiconductor chip is mounted at a front surface side thereof, and then the power module 100 according to the first embodiment is contacted to the cooling apparatus 110 in a state where positioning with respect to the cooling apparatus 110 is performed by the protruding portion 103 for positioning.

In a contact method of the power module 100 according to the first embodiment including a semiconductor device (semiconductor chip), a heat radiation plate (heat sink) 106c to which the semiconductor device is contacted, and a sealing body (package) 101 configured to seal a perimeter of the semiconductor device so as to expose at least one portion of the heat radiation plate 106c; the power module 100 is contacted to the cooling plate (cooling apparatus) 110 via the thermally-conductive material 120. When connecting of the power module 100, the thickness of the thermally-conductive material 120 is regulated by the regulating portions 104 (protruding portion for thickness control) formed on the sealing body 101 or formed as a portion of the sealing body 101.

Since an upper surface of a protruding portion 104 for thickness control is abutting on the contact surface of the cooling apparatus 110, an inside of the spatial area between the heat sink 106c and the cooling apparatus 110 is filled with a sufficient quantity of the thermally-conductive material 120 in a uniform height without air gap forming, and an excessive thermally-conductive material 121 is pushed out to a periphery of the heat sink 106c (outside of the spatial area).

Thus, heat of the power module 100 according to the first embodiment can be effectively dissipated (the power module 100 can be effectively cooled) by efficiently conducting the heat generated from the semiconductor chip from the heat sink 106c to the cooling apparatus 110 via the thermally-conductive material 120.

More specifically, according to the power module 100 according to the first embodiment, the distance between the heat sink 106c and the cooling apparatus 110 can be uniformly controlled in accordance with the thickness of the protruding portion 104 for thickness control, as shown in FIGS. 3A and 3B. Accordingly, also when the thermally-conductive material 120 is applied to the contact surface of the heat sink 106c exposed from the bottom surface facing to the cooling apparatus 110 of the package 101, and heat sink 106c is contacted to the cooling apparatus 110 via the thermally-conductive material 120, the thickness of the thermally-conductive material 120 becomes uneven, and thereby reduction of the cooling performance can be prevented. Accordingly, since the cooling (thermal dissipation) is sufficiently performed, it can suppress that the chip is broken down due to overheating or wiring is fused, and thereby the more reliable power module 100 can be provided.

In this context, power chips, e.g. Silicon Carbide (SiC) power devices, can be listed as a semiconductor chip to be mounted on the power module 100. SiC power devices have low on resistance as compared with conventional Si power devices as IGBT, and also include high switching speed and high temperature operation characteristics. Moreover, large currents can be conducted also in SiC power devices having small areas since the on-resistance of the SiC power device is relatively low, and therefore miniaturization of the SiC power modules can be realized.

The semiconductor chip mounted on the power module 100 is applicable to various semiconductor modules, e.g. not only the SiC power modules but also IGBT modules, diode modules, MOS modules (Si based MOSFETs, SiC based MOSFETs, and GaN based FETs), and the like.

As the package 101, a case type housing may be adopted instead of packages molded with transfer mold resin, e.g. thermosetting resin.

The thermally-conductive material 120 having a coefficient of thermal conductivity within a range of 0.5 W/mK to 300 W/mK is preferable, for example, and an organic material of any one of an epoxy resin, an acrylic resin, a silicone resin, a urethane resin, or polyimide can be used as a simple substance for the thermally-conductive material 120.

Moreover, the thermally-conductive material 120 may be a synthetic resin with which a metal powder or various kinds of ceramic powder is mixed in any one of the above-mentioned organic materials.

Furthermore, various solder, firing silver, and the like to be used by cured by heating may be used, as the thermally-conductive material 120.

The heat sink 106c has a metal having high thermal conductivity, for example. The heat sink 106c may be a leadframe (die pad) on which the semiconductor chip is mounted; or a circuit substrate using any one of copper, a copper alloy, aluminum or an aluminum alloy as a principal element of wiring; or may be a heat spreader etc. contacted to the leadframe. Moreover, the heat sink 106c can also be composed by including a conductive pattern at a side of the surface where no chip is mounted of circuit substrates composed of contacted bodies of metal/ceramics/metal, or insulating substrates (circuit substrates), e.g. a Direct Bonding Copper (DBC) substrate, a Direct Brazed Aluminum (DBA) substrate, and an Active Metal Brazed, Active Metal Bond (AMB) substrates.

An outside shape of the protruding portion 104 for thickness control may be a semicylindrical shape, an elliptic cylindrical shape, or a polygonal prismatic shape (e.g. a triangle shape), other than a cylindrical shape, not dependent on the doughnut shape or non-doughnut shape.

The protruding portion 103 for positioning and the protruding portion 104 for thickness control may be arranged so as to be distributed to a periphery at the side of the exposed surface of the heat sink 106c, instead of being arranged at four corners at the side of the exposed surface of heat sink 106c.

MODIFIED EXAMPLES

First Modified Example

Figure 4A:
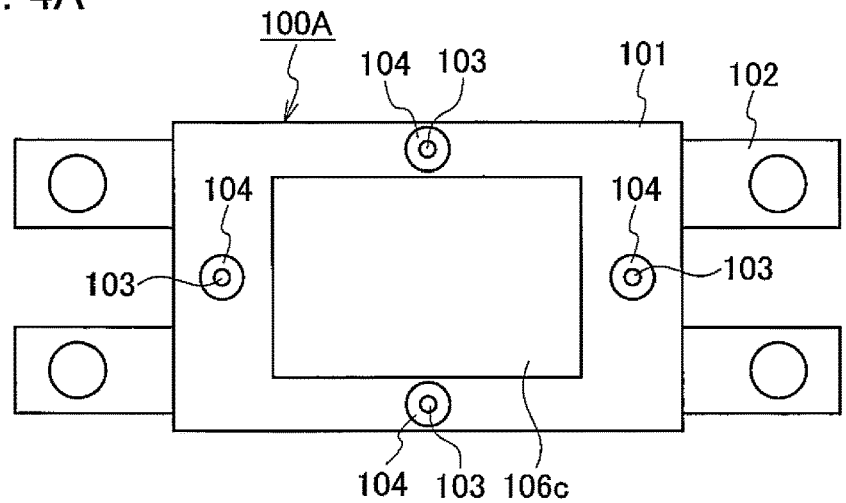
FIG. 4A is a bottom view diagram of a power module according to a first modified example of the first embodiment.

FIG. 4A shows a bottom surface structure of a power module 100A according to a first modified example of the first embodiment. Each of four protruding portions 103 for positioning and four protruding portions 104 for thickness control (doughnut shape) is arranged at a substantially similar position near a center of each periphery side of the exposed surface of the heat sink 106c, other than the four corners.

There is, no limitation in positions and the number of the protruding portions 103 for positioning and the protruding portions 104 for thickness control to be arranged, and the protruding portions 103 for positioning and the protruding portions 104 for thickness control may be arranged so that a balance of at least three protruding portions 103 for positioning and three protruding portions 104 for thickness control may be kept and the thickness of the thermally-conductive material 120 is not uneven.

It is not necessary to always arrange the protruding portion 103 for positioning and the protruding portion 104 for thickness control at the similar position. The protruding portion 103 for positioning and the protruding portion 104 for thickness control may be respectively arranged at different positions.

Second Modified Example

Figure 4B:
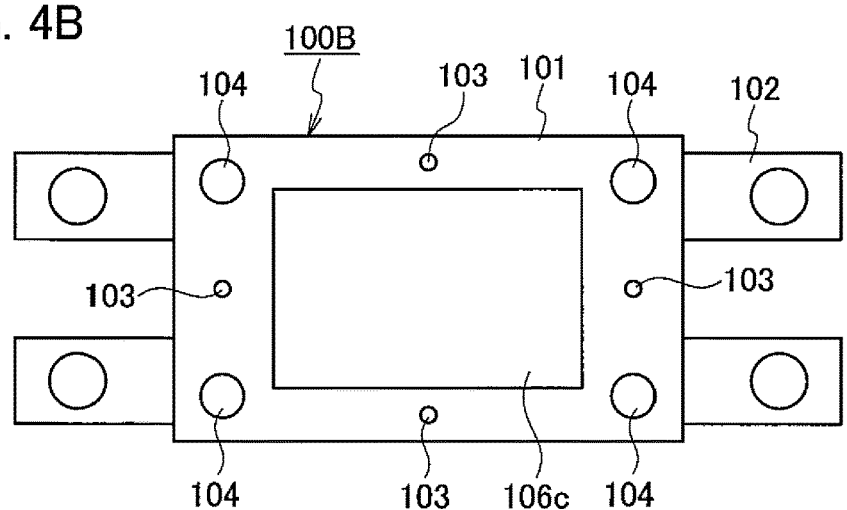
FIG. 4B is a bottom view diagram of a power module according to a second modified example of the first embodiment.

FIG. 4B shows a bottom surface structure of a power module 100B according to a second modified example of the first embodiment. Four (non-doughnut shaped) protruding portions 104 for thickness control are respectively arranged at the four corners at the side of the exposed surface of heat sink 106c, and each of four protruding portions 103 for positioning is arranged in a substantially similar position near a center of each side of the periphery, other than four corners.

Although not shown, four protruding portions 103 for positioning may be respectively arranged at the four corners at the side of the exposed surface of heat sink 106c, and each of four (non-doughnut shaped) protruding portions 104 for thickness control may be arranged in a substantially similar position near a center of each side of the periphery, other than the four corners.

Moreover, it is not necessary to arrange four protruding portions 103 for positioning and four protruding portions 104 for thickness control, and the protruding portions 103 for positioning and the protruding portions 104 for thickness control may be arranged so that a balance of at least three protruding portions 103 for positioning and three protruding portions 104 for thickness control may be kept.

Third Modified Example

Figure 4C:
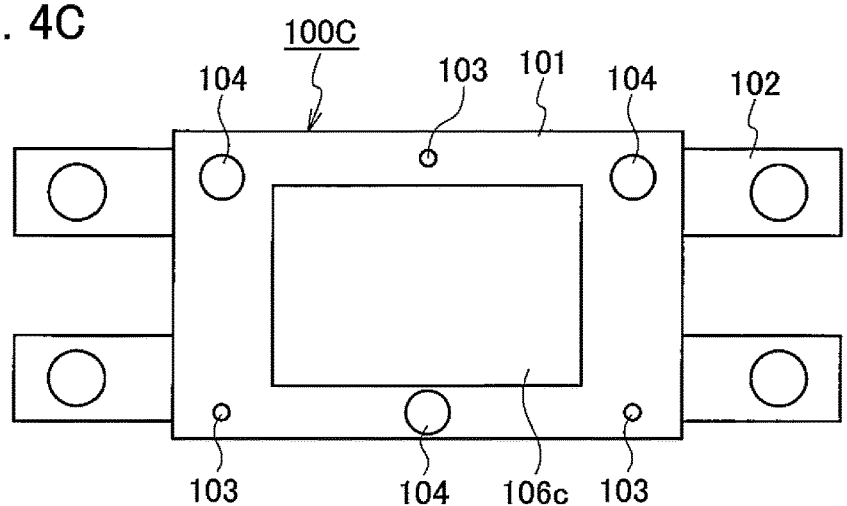
FIG. 4C is a bottom view diagram of a power module according to a third modified example of the first embodiment.

FIG. 4C shows a bottom surface structure of a power module 100C according to a third modified example of the first embodiment. Three respective protruding portions 103 for positioning and three respective (non-doughnut shaped) protruding portions 104 for thickness control are alternately arranged along both sides in a longitudinal direction of a periphery at the side of the exposed surface of heat sink 106c.

Other configurations of the power modules 100A, 100B, and 100C according to the first to third modified examples are similar to the above-mentioned configuration of the power module 100 according to the first embodiment, and a substantially equivalent effect can be obtained.

Also in each configuration, the protruding portion (s) 103 for positioning is not necessary constituent element, and therefore the arrangement of the protruding portion (s) 103 can also be omitted.

Figure 5A:
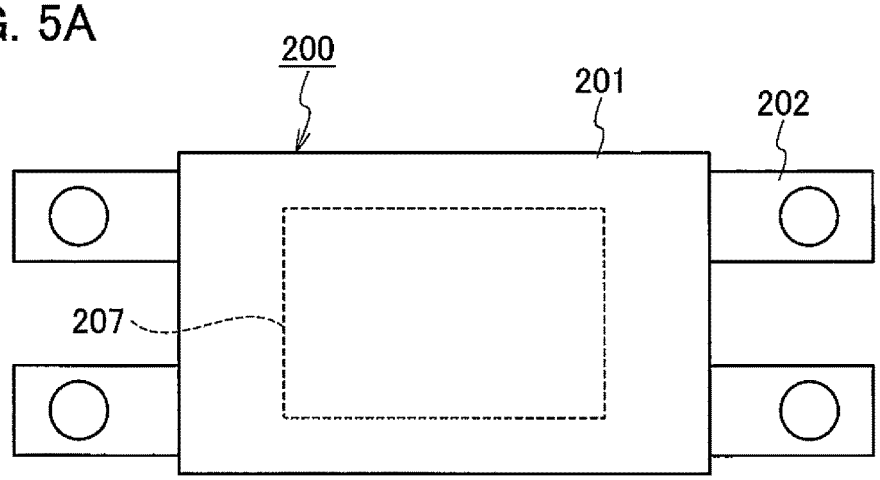
FIG. 5A is a schematic structure of a power module according to the second embodiment, which is a top view diagram of the power module.
Figure 5B:
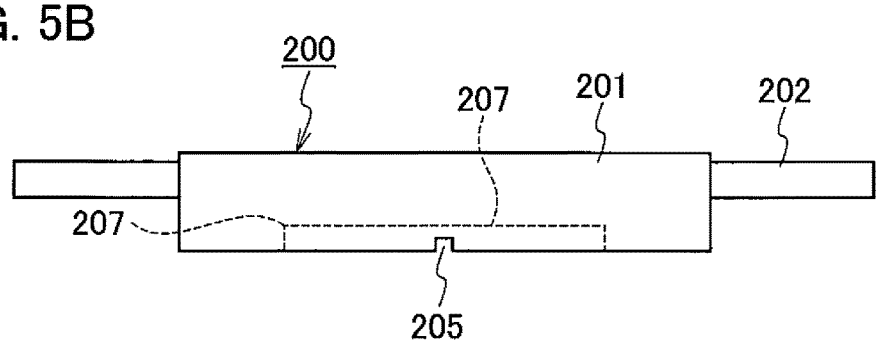
FIG. 5B is a schematic structure of the power module according to the second embodiment, which is a side view diagram of the power module.
Figure 5C:
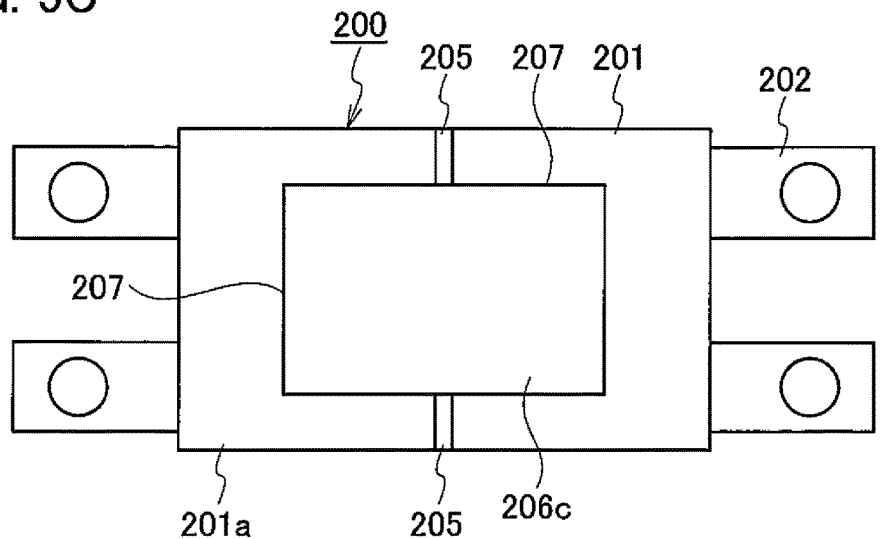
FIG. 5C is a schematic structure of the power module according to the second embodiment, which is a bottom view diagram of the power module.

Second Embodiment (Configuration of Power Module)
FIG. 5A shows a planar structure of a power module 200 according to the second embodiment, FIG. 5B shows a side surface structure of the power module 200, and FIG. 5C shows a bottom surface structure of the power module 200.

In the power module 200 according to the second embodiment, as shown in FIGS. 5A to 5C, a perimeter of a semiconductor chip (semiconductor device) which is not shown is molded with a package (sealing body) 201, except for a lead terminal 202 configured to extend to a side surface direction.

Moreover, as shown in FIG. 5C, a surface of a heat sink (heat radiation plate) 206c, which mounts a semiconductor chip, for example, to be contacted with the cooling apparatus (cooling plate) 210 to be mentioned below is substantially extensively exposed from a concave region 207 formed on a bottom surface of the package 201, in the power module 200. However, it may be configured so that at least a portion of the heat sink 206c is only exposed therefrom.

Moreover, in the power module 200, as shown in FIGS. 5B and 5C, a convex-shaped protruding portion (regulating portion) 201a for thickness control is formed at a periphery of the concave region 207 of the exposed surface (contact surface) of the heat sink 206c on the bottom surface of the package 201 facing to the cooling apparatus 210 so that protruding portion (regulating portion) 201a is protruded from the exposed surface.

More specifically, the protruding portion 201a for thickness control is formed by forming the periphery of the bottom surface of the package 201 to be thicker than other portions so that the exposed surface of the heat sink 206c becomes a concave region 207 on the bottom surface of the package 201, and a spatial area to be embedded with a predetermined quantity of the thermally-conductive material 220 between the heat sink 206c and the cooling apparatus 210 is formed in accordance with the height (thickness) of the protruding portion 201a. More specifically, the concave region 207 formed on the exposed surface of the heat sink 206c becomes a spatial area to be embedded with the predetermined quantity of the thermally-conductive material 220 so as to be dented from the mold surface of the protruding portion 201a for thickness control, between the heat sink 206c and the cooling apparatus 210.

The protruding portion 201a for thickness control is configured to surround the exposed surface of the heat sink 206c in a substantially rectangular shape (square shape), and the thickness of the protruding portion 201a is within a range from approximately 0.1 mm to approximately 1.0 mm.

Moreover, although the inside of the spatial area (concave region 207) between the heat sink 206c and the cooling apparatus 210 is filled with a sufficient quantity of the thermally-conductive material 220 in a uniform height without air gap forming, at the time of connecting, a discharge groove 205 for discharging an excessive thermally-conductive material 221 to an outside of the spatial area at this time is formed on the protruding portion 201a for thickness control.

The discharge grooves 205 are respectively formed at substantially similar positions of the protruding portion 201a for thickness control near centers of both sides in a longitudinal direction of the rectangular-shaped package 201 in a horizontal direction orthogonal to a direction of facing to the cooling apparatus 210, along a non-longitudinal direction (first direction) of the package 201. The discharge grooves 205 has effects of not only discharging the excessive thermally-conductive material 221 but also extracting air bubbles contained in the thermally-conductive material 220.

Since the distance between the heat sink 206c and the cooling apparatus 210 (i.e., thickness of the thermally-conductive material 220) at the time of contacting the heat sink 206c to the cooling apparatus 210 can be controlled in accordance with a height to a mold surface of the protruding portion 201a for thickness control, the thickness of the thermally-conductive material 220 can be easily prevented from becoming uneven due to a variation in a quantity of the applied material of the thermally-conductive material 220, an unbalance of pressurization at the time of connecting, etc.

Other configurations are fundamentally similar to the above-mentioned configuration of the power module 100 according to the first embodiment, and a substantially equivalent effect can be obtained.

(Thermal Dissipation Structure/Contact Method)

Figure 6A:
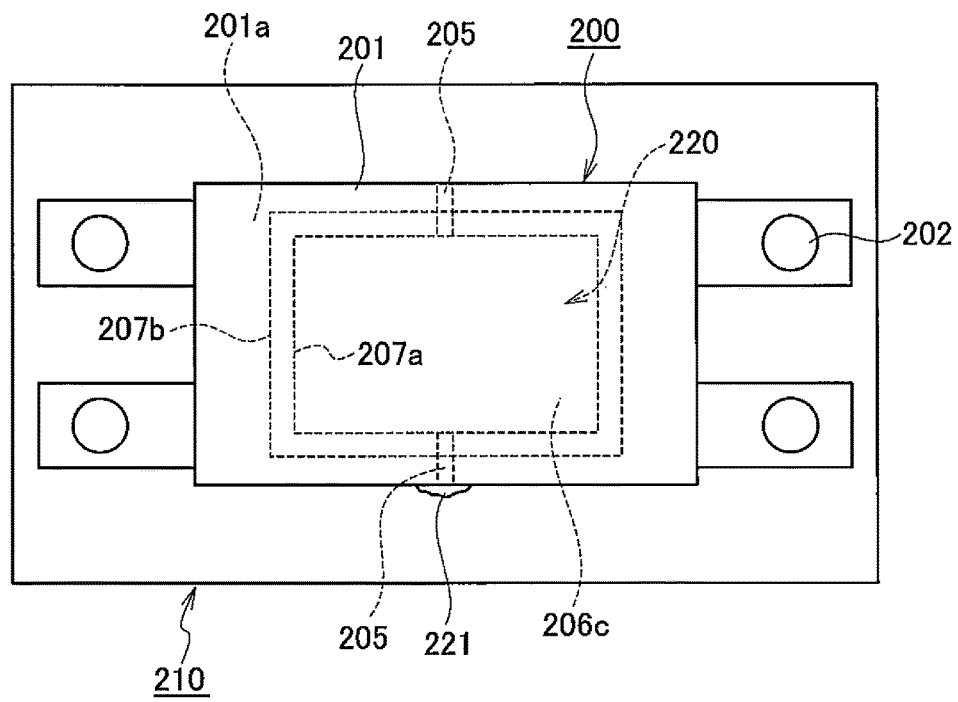
FIG. 6A is a top view diagram showing a state of contacting the power module according to the second embodiment to the cooling apparatus (thermal dissipation structure).
Figure 6B:
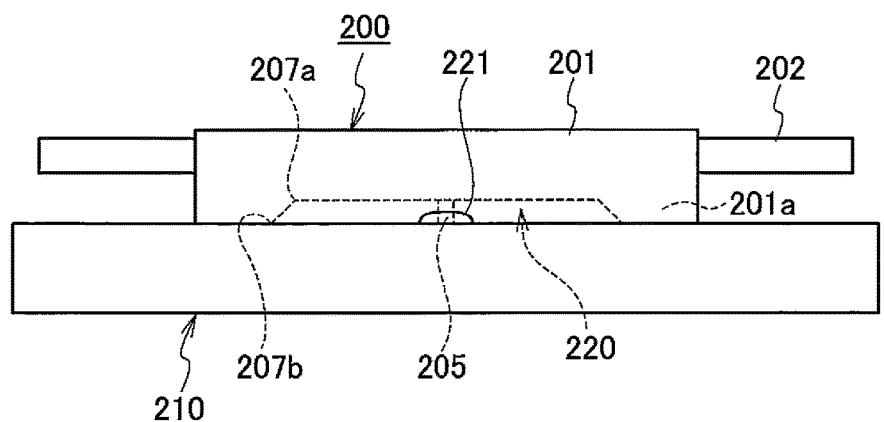
FIG. 6B is a side view diagram of FIG. 6A.

FIGS. 6A and 6B show a thermal dissipation structure of contacting a power module 200 according to the second embodiment to the cooling apparatus 210.

More specifically, as shown in FIGS. 6A and 6B, the power module 200 according to the second embodiment is contacted to the cooling apparatus 210 in a state where a quantity which is a little larger than the predetermined quantity, of the thermally-conductive material 220 is embedded in the spatial area (concave region 207) on the heat sink 206c inside the protruding portion 201a for thickness control formed so that the exposed bottom surface facing to the cooling apparatus 210 of the package 201 at a back surface side of the heat sink 206c on which the semiconductor chip is mounted at a front surface side thereof.

When the mold surface of the protruding portion 201a for thickness control is abutting on the contact surface of the cooling apparatus 210, the inside of the spatial area (concave region 207) between the heat sink 206c and the cooling apparatus 210 is filled with a sufficient quantity of the thermally-conductive material 220 in a uniform height without air gap forming, and an excessive thermally-conductive material 221 is discharged from the discharge groove 205 toward an outside (outside of the spatial area).

Thus, heat of the power module 200 according to the second embodiment can be effectively dissipated (the power module 200 can be effectively cooled) by efficiently conducting the heat generated from the semiconductor chip from the heat sink 206c to the cooling apparatus 210 via the thermally-conductive material 220.

More specifically, according to the power module according to the second embodiment 200, the distance between the heat sink 206c and the cooling apparatus 210 can be uniformly controlled in accordance with the height to the mold surface of the protruding portion 201a for thickness control, as shown in FIGS. 6A and 6B. Thus, also when the thermally-conductive material 220 is embedded in the contact surface of the heat sink 206c exposed from the bottom surface facing to the cooling apparatus 210 of the package 201, and heat sink 206c is contacted to the cooling apparatus 210 via the thermally-conductive material 220, the thickness of the thermally-conductive material 220 becomes uneven, and thereby reduction of the cooling performance can be prevented. Accordingly, since the cooling (thermal dissipation) is sufficiently performed, it can suppress that the chip is broken down due to overheating or wiring is fused, and thereby the more reliable power module 200 can be provided.

The package 201 including the protruding portion 201a for thickness control and the discharge groove 205 can be easily made by applying simple work with respect to the metallic mold, for example.

In addition, with regard to the concave region 207, as shown in FIGS. 6A and 6B, a predetermined inclined portion may be formed between an opening 207a at the side of the exposed surface of the heat sink 206c and an opening 207b at the side of the mold surface of the protruding portion 201a for thickness control, on the bottom surface of the package 201.

The protruding portion 201a for thickness control may be arranged so as to surround the periphery at the side of the exposed surface of the heat sink 206c in a quadrangular shape, or so as to surround the periphery at the side of the exposed surface of the heat sink 206c in a ring shape (circle shape), e.g. an elliptical shape.

It is not limited to the case where only one pair of the discharge grooves 205 are respectively formed at substantially similar positions near centers of both sides in a longitudinal direction of the rectangular-shaped package 201 in a horizontal direction orthogonal to a direction of facing to the cooling apparatus 210, along a non-longitudinal direction (first direction) of the package 201.

MODIFIED EXAMPLES

First Modified Example

Figure 7A:
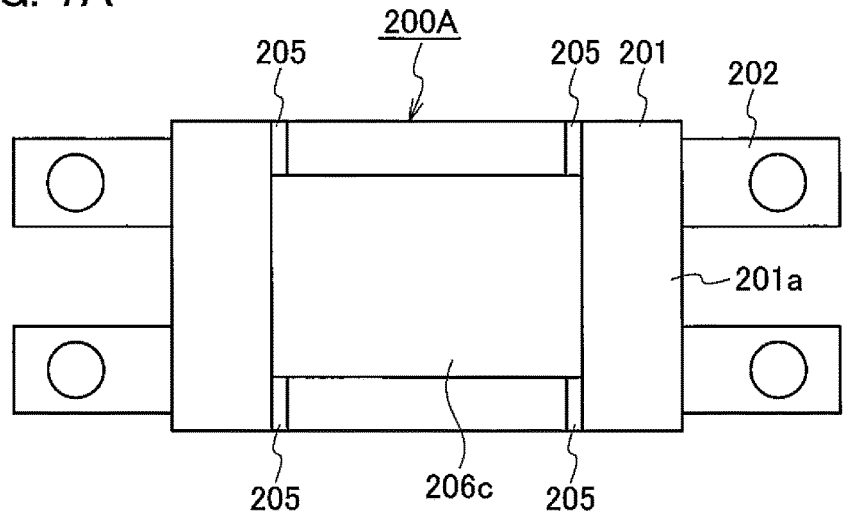
FIG. 7A is a bottom view diagram of a power module according to a first modified example of the second embodiment.

FIG. 7A shows a bottom surface structure of a power module 200A according to a first modified example of the second embodiment. More specifically, in the power module 200A, two sets of the discharge grooves 205 reaching the spatial area on the heat sink 206c are formed along a non-longitudinal direction (first direction) of the rectangular-shaped package 201 at substantially similar positions of the protruding portion 201a for thickness control in near edges of the heat sink 206c at both sides in a longitudinal direction of the rectangular-shaped package 201, in a horizontal direction orthogonal to a direction facing to the cooling apparatus 210.

Second Modified Example

Figure 7B:
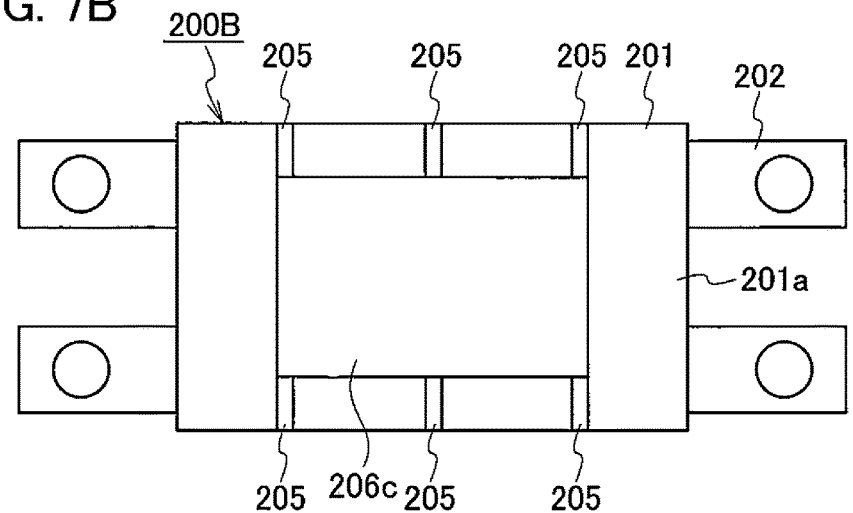
FIG. 7B is a bottom view diagram of a power module according to a second modified example of the second embodiment.

FIG. 7B shows a bottom surface structure of a power module 200B according to a second modified example of the second embodiment. More specifically, in the power module 200B, two sets of the discharge grooves 205 reaching the spatial area on the heat sink 206c are formed along a non-longitudinal direction (first direction) of the package 201 at substantially similar positions of the protruding portion 201a for thickness control in near centers at both sides in a longitudinal direction of the rectangular-shaped package 201 and near edges of the heat sink 206c, in a horizontal direction orthogonal to a direction facing to the cooling apparatus 210.

It is not limited to only the case where one set (pair) of the discharge grooves 205 (the same number of the discharge grooves 205 per one set) are formed at the both sides in the longitudinal direction of the package 201. The position and the number of the discharge groove 205 formed along each side of the longitudinal direction can be arbitrarily changed.

Third Modified Example

Figure 7C:
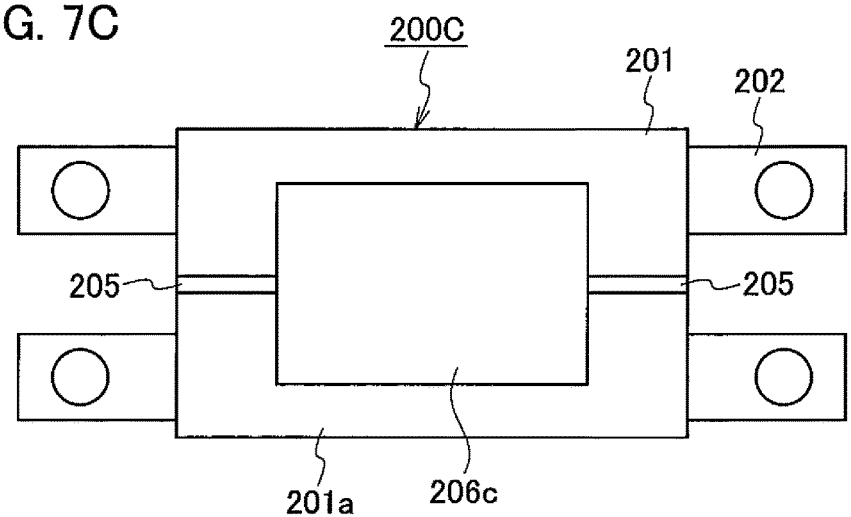
FIG. 7C is a bottom view diagram of a power module according to a third modified example of the second embodiment.

FIG. 7C shows a bottom surface structure of a power module 200C according to a third modified example of the second embodiment. More specifically, in the power module 200C, one set of discharge grooves 205 reaching the spatial area on the heat sink 206c are formed at substantially similar positions of the protruding portion 201a for thickness control near centers of both sides in a non-longitudinal direction of the rectangular-shaped package 201 in a horizontal direction orthogonal to a direction of facing to the cooling apparatus 210, along a longitudinal direction (second direction) of the package 201.

Fourth Modified Example

Figure 8A:
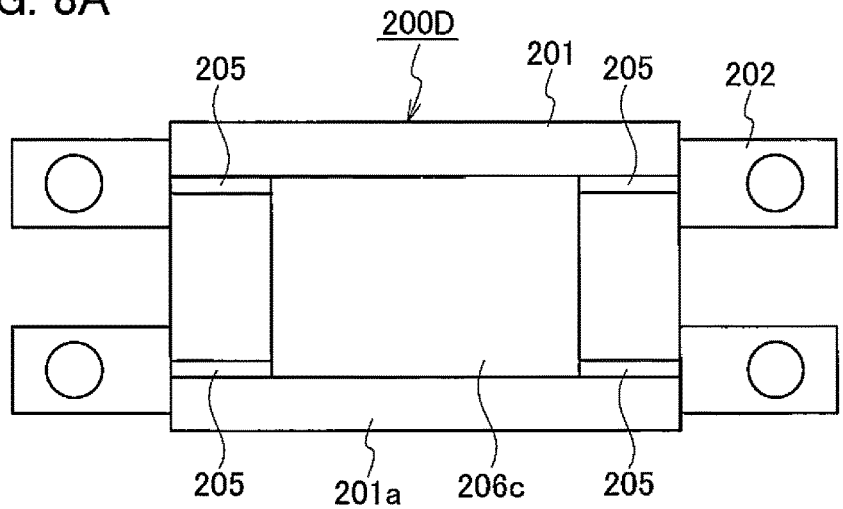
FIG. 8A is a bottom view diagram of a power module according to a fourth modified example of the second embodiment.

FIG. 8A shows a bottom surface structure of a power module 200D according to a fourth modified example of the second embodiment. More specifically, in the power module 200D, two sets of the discharge grooves 205 reaching the spatial area on the heat sink 206c are formed along a longitudinal direction (second direction) of the rectangular-shaped package 201 at substantially similar positions of the protruding portion 201a for thickness control in near edges of the heat sink 206c at both sides in a non-longitudinal direction of the rectangular-shaped package 201, in a horizontal direction orthogonal to a direction facing to the cooling apparatus 210.

Fifth Modified Example

Figure 8B:
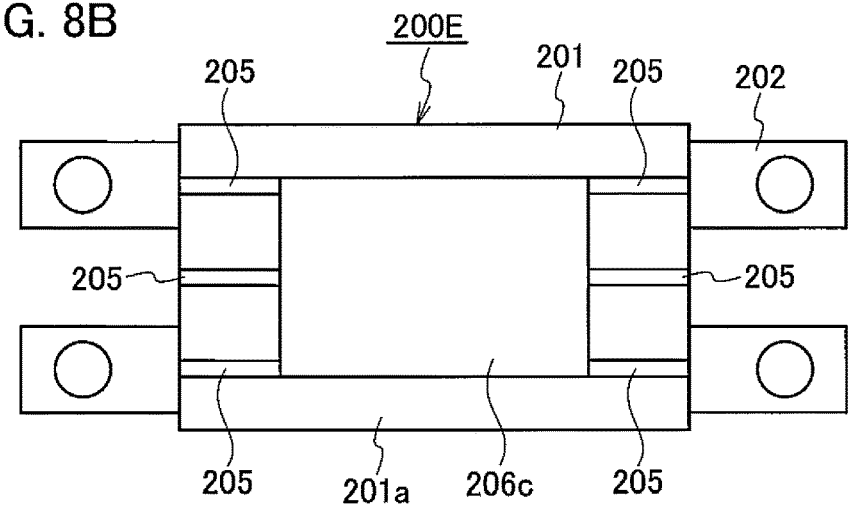
FIG. 8B is a bottom view diagram of a power module according to a fifth modified example of the second embodiment.

FIG. 8B shows a bottom surface structure of a power module 200E according to a fifth modified example of the second embodiment. More specifically, in the power module 200E, three sets of the discharge grooves 205 reaching the spatial area on the heat sink 206c are formed along a longitudinal direction (second direction) of the rectangular-shaped package 201 at substantially similar positions of the protruding portion 201a for thickness control in near centers at both sides in a non-longitudinal direction of the rectangular-shaped package 201 and near edges of the heat sink 206c, in a horizontal direction orthogonal to a direction facing to the cooling apparatus 210.

It is not limited to only the case where the discharge grooves 205 are formed in any one of the longitudinal direction or non-longitudinal direction of the package 201. It is also possible to adopt a configuration of forming the discharge grooves 205 at the both sides in the longitudinal direction and the non-longitudinal direction.

Sixth Modified Example

Figure 8C:
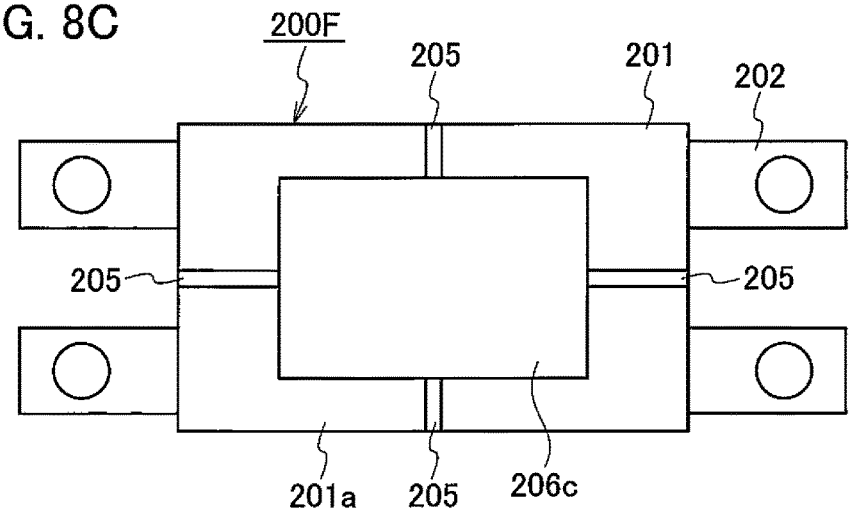
FIG. 8C is a bottom view diagram of a power module according to a sixth modified example of the second embodiment.

FIG. 8C shows a bottom surface structure of a power module 200F according to a sixth modified example of the second embodiment. More specifically, in the power module 200F, one set of the discharge grooves 205 reaching the spatial area on the heat sink 206c are formed along a non-longitudinal direction (first direction) and a longitudinal direction (second direction) of the package 201 at substantially similar positions of the protruding portion 201a for thickness control in near centers at both sides in the longitudinal direction and near centers at both sides in the non-longitudinal direction of the rectangular-shaped package 201, in a horizontal direction orthogonal to a direction facing to the cooling apparatus 210.

Seventh Modified Example

Figure 9A:
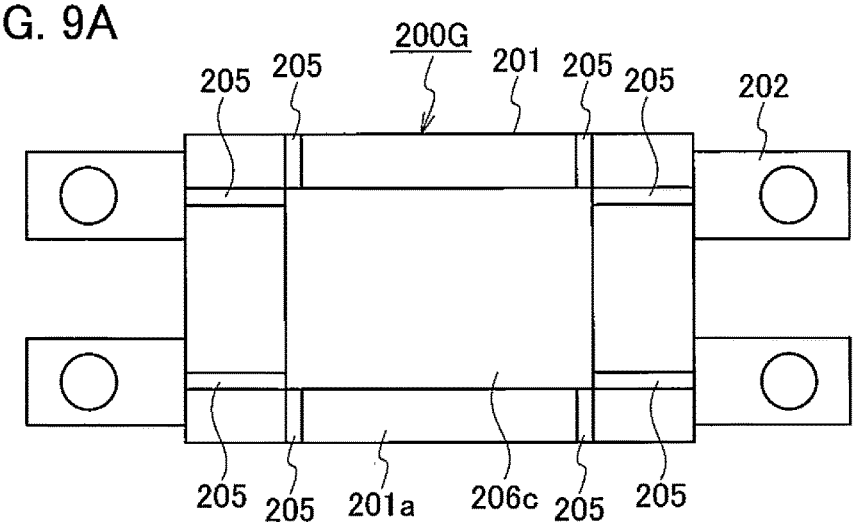
FIG. 9A is a bottom view diagram of a power module according to a seventh modified example of the second embodiment.

FIG. 9A shows a bottom surface structure of a power module 200G according to a seventh modified example of the second embodiment. More specifically, in the power module 200G, two sets of the discharge grooves 205 reaching the spatial area on the heat sink 206c are formed along a non-longitudinal direction (first direction) and a longitudinal direction (second direction) of the package 201 at substantially similar positions of the protruding portion 201a for thickness control in near edges of the heat sink 206c at both sides in a longitudinal direction and near edges of the heat sink 206c at both sides in a non-longitudinal direction of the rectangular-shaped package 201, in a horizontal direction orthogonal to a direction facing to the cooling apparatus 210.

It is not limited to only the case where the discharge grooves 205 are formed in any one of the longitudinal direction and/or non-longitudinal direction of the package 201. It is also possible to adopt a configuration of forming the discharge grooves 205 in an oblique direction (third direction) different from the longitudinal direction and non-longitudinal direction.

Eighth Modified Example

Figure 9B:
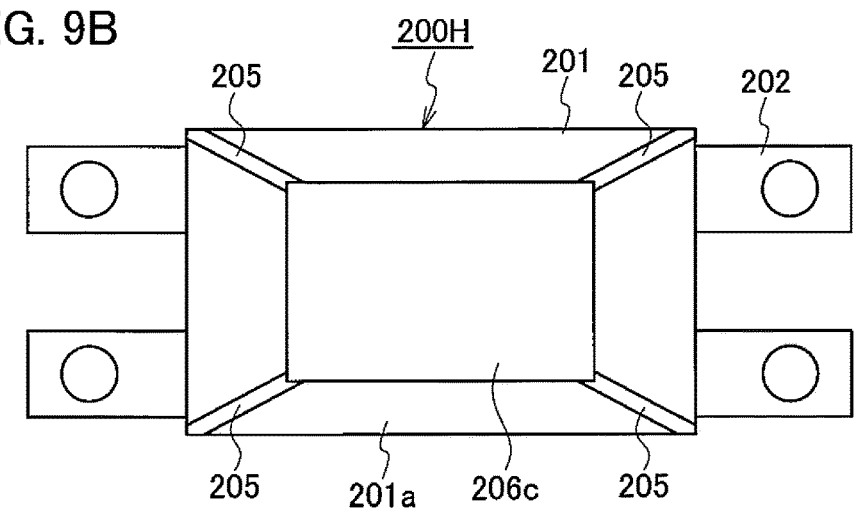
FIG. 9B is a bottom view diagram of a power module according to a eighth modified example of the second embodiment.

FIG. 9B shows a bottom surface structure of a power module 200H according to a eighth modified example of the second embodiment. More specifically, in the power module 200H, four discharge grooves 205 are respectively formed in an oblique direction so as to reach the four corners of the spatial area on the heat sink 206c at substantially similar positions of four corners of the protruding portion 201a for thickness control in the rectangular-shaped package 201 in a horizontal direction orthogonal to a direction facing to the cooling apparatus 210.

It is not limited to only the case where the discharge grooves 205 are formed in any one of the longitudinal direction, non-longitudinal direction, or oblique direction of the package 201. It is also possible to adopt a configuration of forming the discharge grooves 205 at the both sides in the longitudinal direction, the non-longitudinal direction, and the oblique direction.

Ninth Modified Example

Figure 9C:
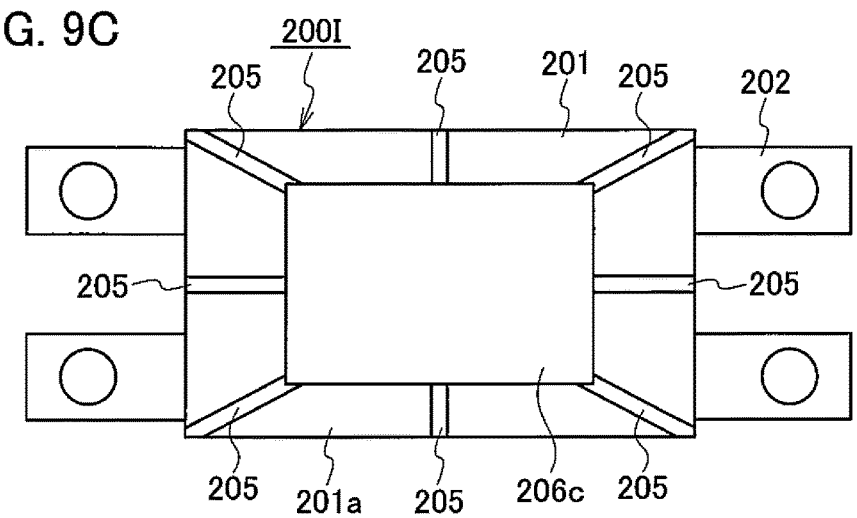
FIG. 9C is a bottom view diagram of a power module according to a ninth modified example of the second embodiment.

FIG. 9C shows a bottom surface structure of a power module 200I according to a ninth modified example of the second embodiment. More specifically, in the power module 200I, the discharge grooves 205 in a longitudinal direction, a non-longitudinal direction, and an oblique direction are respectively formed so as to reach the spatial area on the heat sink 206c at substantially similar positions of the protruding portion 201a for thickness control in near centers at both sides in the longitudinal direction, near centers at both sides in the non-longitudinal direction, and four corners of the rectangular-shaped package 201, in a horizontal direction orthogonal to a direction facing to the cooling apparatus 210.

Other configurations of the power modules 200A to 200I according to the first to ninth modified examples have the similar configuration as the above-mentioned power module according to the second embodiment 200, and a substantially equivalent effect can be obtained.

If forming the discharge groove 205 at the corner portion of the heat sink 206c, there is almost no possibility that any air pocket occurs due to the corner portion being not filled with the thermally-conductive material 220.

Third Embodiment

Figure 10:
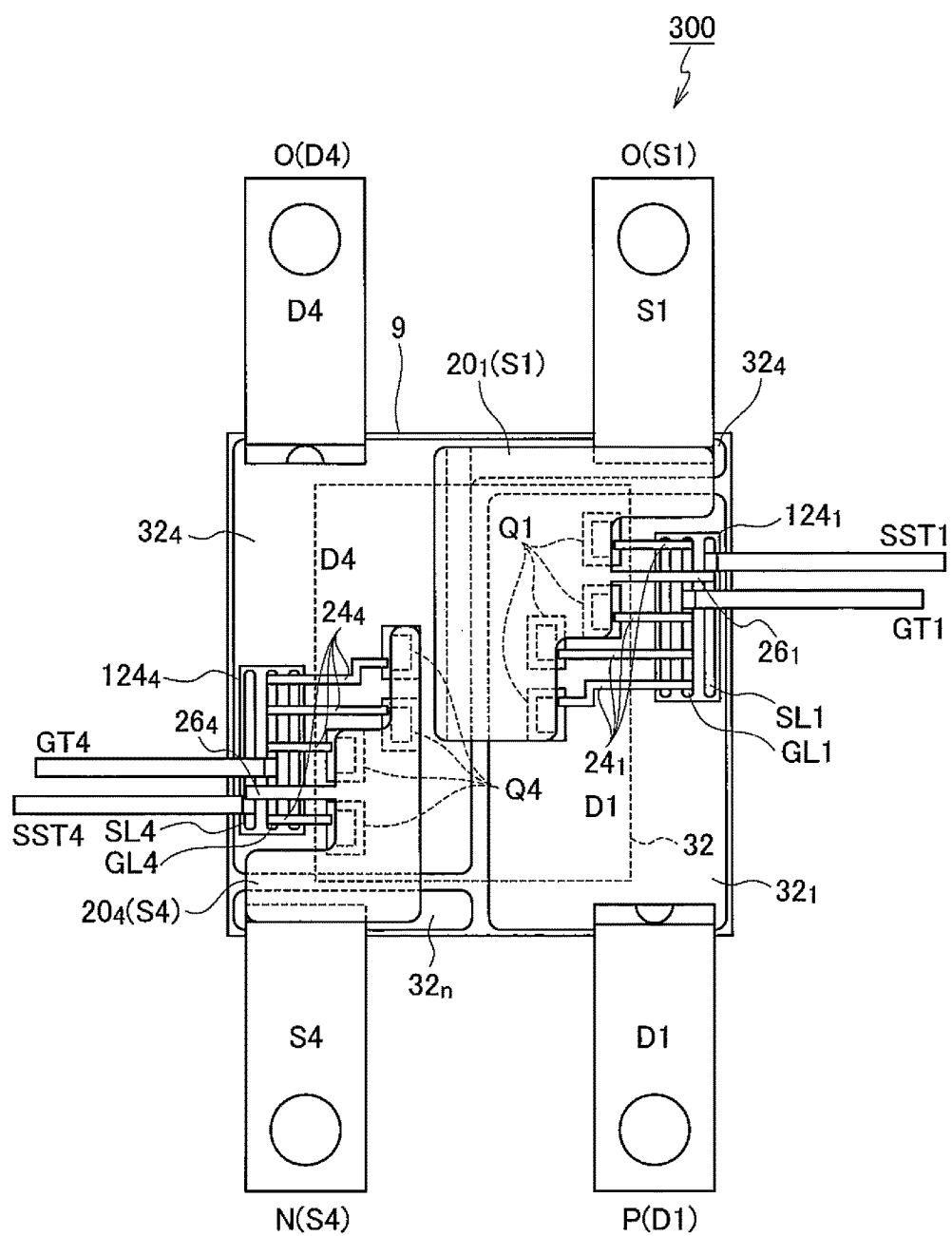
FIG. 10 is a planar pattern configuration diagram showing a power module according to a third embodiment (2-in-1 module) such that an inside thereof is in a transmitted state, as an example of a module with the built-in half-bridge.
Figure 11:
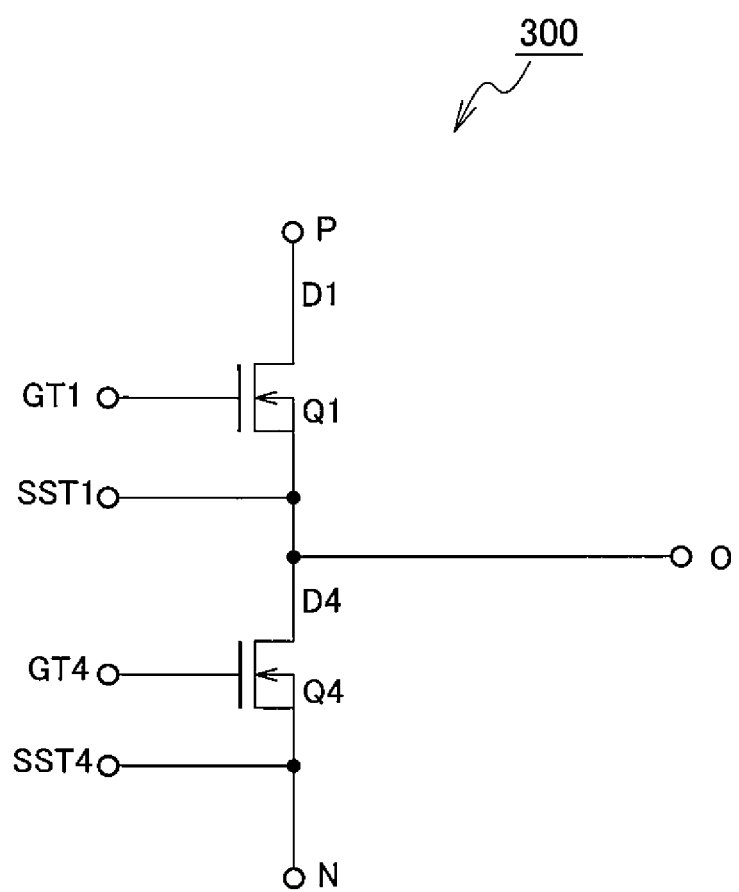
FIG. 11 is a circuit configuration diagram of the power module according to the third embodiment (2-in-1 module (module with the built-in half-bridge)).
Figure 12:
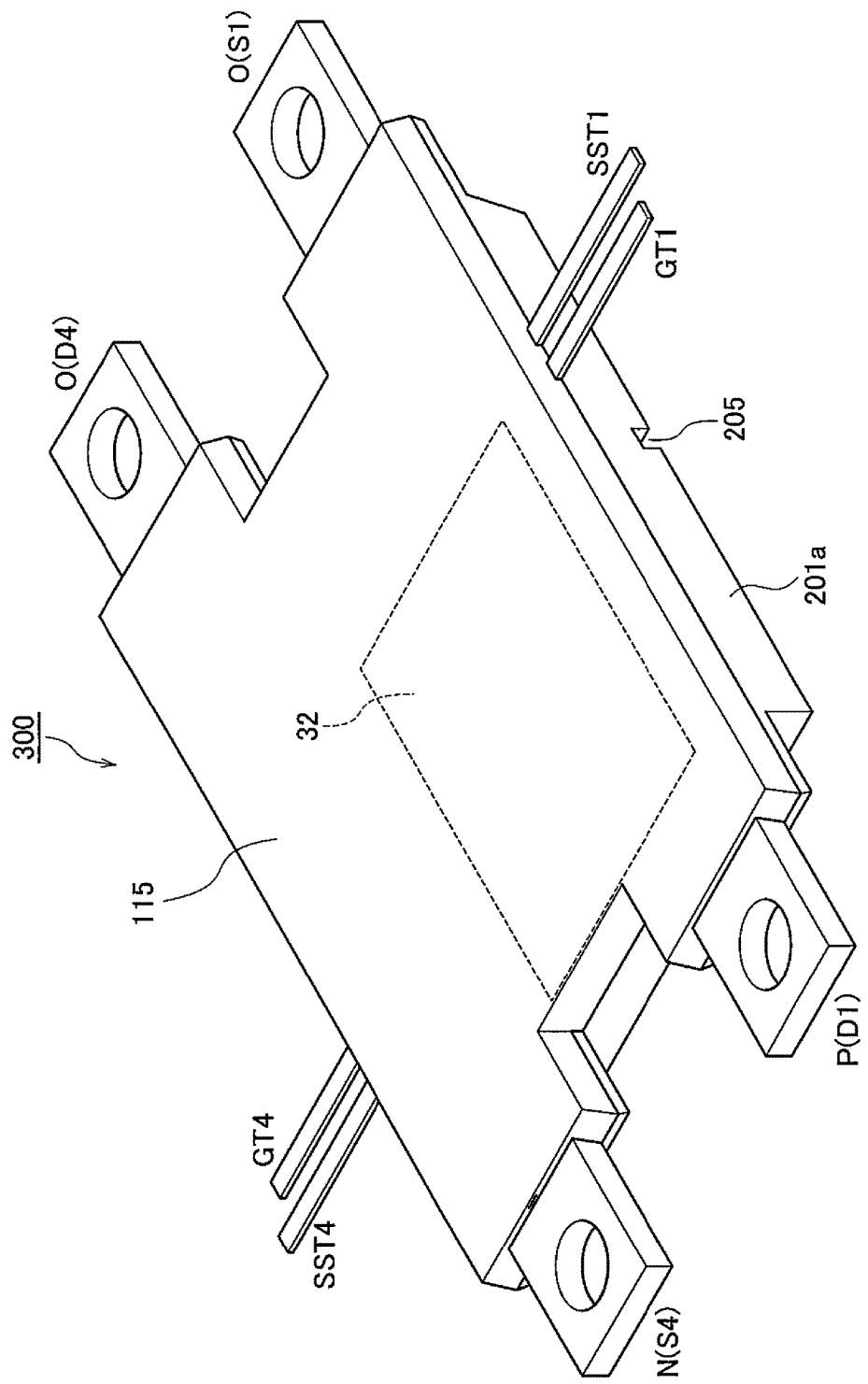
FIG. 12 is a bird's-eye view configuration diagram (perspective diagram) of the power module according to the third embodiment (2-in-1 module (module with the built-in half-bridge)).

FIG. 10 shows a schematic planar pattern configuration before forming a resin layer (sealing body) 115 in a 2-in-1 module (module with a built-in half-bridge), in a power module 300 according to a third embodiment, and FIG. 12 shows a schematic bird's-eye view configuration after forming the resin layer 115. Moreover, FIG. 11 shows a circuit configuration of the 2-in-1 module (module with the built-in half-bridge) corresponding to FIG. 10 to which SiC MOS- FET is applied as a semiconductor device, in the power module 300 according to the third embodiment.

The power module 300 according to the third embodiment includes a configuration of a module with the built-in half-bridge in which two MOSFETs Q1, Q4 are built in one module.

In this case, although the module can be considered as one large transistor, one piece or a plurality of transistors (chips) may be contained therein. More specifically, there are 1-in-1, 2-in-1, 4-in-1, 6-in-1 modules, etc. as the modules. For example, a module containing two pieces of transistors on one module is called the 2-in-1 module, a module containing two pieces of 2-in-1 modules on one module is called the 4-in-1 module, and a module containing three pieces of 2-in-1 modules on one module is called the 6-in-1 module.

FIG. 10 shows an example of 4-chip of the MOSFETs Q1 and 4-chip of the MOSFETs Q4 respectively disposed in parallel.

As shown in FIG. 12, the power module 300 according to the third embodiment includes: a positive-side power terminal P and a negative-side power terminal N disposed at a first side of the ceramic substrate 9 covered with the resin layer 115; a gate terminal GT1 and a source sense terminal SST1 disposed at a second side adjacent to the first side; an output terminal O disposed at a third side opposite to the first side; and a gate terminal GT4 and a source sense terminal SST4 disposed at a fourth side opposite to the second side.

As shown in FIG. 10, the gate terminal GT1 and the source sense terminal SST1 are connected to the gate signal electrode pattern GL1 and the source signal electrode pattern SL1 in the MOSFET Q1; and the gate terminal GT4 and the source sense terminal SST4 are connected to the gate signal electrode pattern GL4 and the source signal electrode pattern SL4 in the MOSFET Q4.

As shown in FIG. 10, divided leadframes $24_1$ and $24_4$ for gate and divided leadframes $26_1$ and $26_4$ for source signal are connected from the MOSFETs Q1 and Q4 toward the gate signal electrode patterns GL1 and GL4 and the source signal electrode patterns SL1, SL4 which are respectively disposed on the signal substrates $124_1$ and $124_4$. Moreover, gate terminals GT1 and GT4 and source sense terminals SST1 and SST4 for external extraction are connected to the gate signal electrode patterns GL1 and GL4 and the source sense signal electrode patterns SL1 and SL4 by soldering etc.

As shown in FIG. 10, the signal substrates $124_1$ and $124_4$ are connected by soldering etc. on the ceramics substrate 9.

Although illustration is omitted in FIGS. 10 to 12, diodes may be respectively connected reversely in parallel between a drain D1 and a source Si and between a drain D4 and a source S4 of the MOSFETs Q1 and Q4.

In the example shown in FIGS. 10-12, the sources S1 and S4 in 4 chips of the MOSFETs Q1 and Q4 disposed in parallel are commonly connected with the divided leadframes $20_1$ (S1) and $20_4$ (S4) for source.

The positive-side power terminal P and the negative-side power terminal N, and the gate terminals GT1 and GT4 and the source sense terminals SST1 and SST4 for external extraction can be formed of Cu, for example.

The signal substrates $124_1$ and $124_4$ can be formed by including a ceramics substrate. The ceramic substrate 8 may be formed by including: $Al_2O_3$, AlN, SiN, AlSiC; or SiC of which at least the front side surface has insulating property, for example.

Main wiring conductors (electrode patterns) $32_1$, $32_4$, and $32_n$ can be formed by including Cu, Al, etc., for example.

The divided leadframes $20_1$ (S1) and $20_4$ (S4) for source connected to the sources S1 and S4 of MOSFETs Q1 and Q4 may be formed by including Cu, CuMo, etc., for example.

In this case, if materials of the same size of which the values of Coefficient of Thermal Expansion (CTE) are equivalent to each other are compared, the generated stress of materials having a larger value of Young's modulus becomes larger than that of materials having a smaller value of Young's modulus. Accordingly, if materials of which the value of Young's modulus×CTE is smaller is selected, structural members having a smaller value of the generated stress can be obtained. CuMo has such an advantage. Moreover, although CuMo is inferior to Cu, the electric resistivity of CuMo is also relatively low. Moreover, a separation distance along the front side surface between the divided leadframes $20_1$ (S1) and $20_4$ (S4) for source is called a creepage distance. A value of the creepage distance thereof is approximately 2 mm, for example.

The divided leadframes $24_1$ and $24_4$ for gate and the divided leadframes $26_1$ and $26_4$ for source signal can be formed by including Al, AlCu, etc., for example.

SiC based power devices, e.g. SiC DIMOSFET and SiC TMOSFET, or GaN based power devices, e.g. GaN based High Electron Mobility Transistor (HEMT), are applicable as the MOSFETs Q1 and Q4. In some instances, power devices, e.g. Si based MOSFETs and IGBT, are also applicable thereto.

In the power module 300 according to the third embodiment, 4 chips of the MOSFETs Q1 are disposed on the main wiring conductor (electrode pattern) $32_1$ via the soldering layer under chip. Similarly, 4 chips of the MOSFETs Q4 are disposed on the main wiring conductor (electrode pattern) $32_4$ via the soldering layer under chip.

More particularly, as shown in FIG. 10, a principal portion of the power module 300 according to the third embodiment includes: a ceramics substrate 9; a source electrode pattern $32n$, drain electrode patterns $32_1$ and $32_4$, source signal electrode patterns SL1 and SL4, and gate signal electrode patterns GL1 and GL4 respectively disposed on the ceramics substrate 9; semiconductor devices Q1 and Q4 respectively disposed on the drain electrode patterns $32_1$ and $32_4$, the semiconductor devices Q1 and Q4 respectively including a source pad electrode and a gate pad electrode at a front surface side; divided leadframes $20_1$ (S1) and $20_4$ (S4) for source respectively bonded to the source electrode pattern $32_n$, the drain electrode pattern $32_4$, and the source pad electrode; and a divided leadframe for gate pad electrode bonded to a gate pad electrode.

Illustration of the divided leadframes for gate pad electrode is omitted in FIG. 10 since the divided leadframes for gate pad electrode are disposed under the divided leadframes $24_1$ and $24_4$ for gate. Since the drain electrode pattern $32_4$ serves also as a source electrode of the semiconductor device Q1 while the drain electrode pattern $32_4$ is a drain electrode of the semiconductor device Q4, the drain electrode pattern $32_4$ is connected to the divided leadframe $20_1$ (S1) for source.

Furthermore, as shown in FIG. 10, the power module 300 according to the third embodiment includes: divided leadframes $26_1$, $26_4$ for source signal respectively and electrically connected to the divided leadframes $20_1$ (S1), $20_4$ (S4) for source, the divided leadframes $26_1$, $26_4$ for source signal respectively disposed on the source signal electrode patterns SL1, SL4; and divided leadframes $24_1$ and $24_4$ for gate respectively and electrically connected with the divided leadframes for gate pad electrode, the divided leadframes $24_1$, $24_4$ for gate respectively disposed on the gate signal electrode patterns GL1 and GL4. Assembling connection of the divided leadframes $24_1$ and $24_4$ for gate is performed via the insulating portion (dividing portion) with respect to the divided leadframes $20_1$ (S1) and $20_4$ (S4) for source.

The divided leadframes $24_1$ and $24_4$ for gate are respectively bonded to the gate signal electrode patterns GL1 and GL4 via the soldering layer under divided leadframe for gate.

The divided leadframes $26_1$ and $26_4$ for source signal are respectively bonded to the source signal electrode patterns SL1 and SL4 via the soldering layer under divided leadframe for source signal.

In addition, a material of the divided leadframes $26_1$ and $26_4$ for source signal and a material of the divided leadframes $20_1$ (S1) and $20_4$ (S4) for source may be the same.

Moreover, a material of the divided leadframes $24_1$ and $24_4$ for gate and a material of the divided leadframes for gate pad electrode may be the same.

As shown in FIG. 10, also in the power module 300 according to the third embodiment, the divided leadframes for gate pad electrode are respectively extended so as to be integrally connected to the divided leadframes $24_1$ and $24_4$ for gate functioned also as gate signal lines.

Similarly, as shown in FIG. 10, also in the power module 300 according to the third embodiment, the divided leadframes $20_1$ (S1) and $20_4$ (S4) for source are respectively extended so as to be integrally connected to the divided leadframes $26_1$ and $26_4$ for source signal functioned also as source sense signal lines.

In the power module 200 according to the third embodiment, the source signal bonding wire and the gate signal bonding wire can be eliminated by adopting such a divided leadframe structure (($20_1$ and $20_4$), ($26_1$ and $26_4$), ($24_1$ and $24_4$)).

Also in the power module 300 according to the third embodiment, the stress relaxation layer may be disposed between the divided leadframes $20_1$ (S1), $20_4$ (S4) for source and the source pad electrode.

In the power module according to the third embodiment 300 of such a configuration, as shown in FIG. 12, a heat sink (heat radiation plate) 32 composed by including a main wiring conductor (electrode pattern) is formed on a back surface side of the ceramics substrate 9 on which the MOSFETs Q1 and Q4 of 4 chips configuration are mounted. The heat sink 32 may be a heat radiation plate contacted to the main wiring conductor on the back surface side of the ceramics substrate 9, and a part or all of the contact surface with respect to the cooling apparatus (not shown) is disposed so as to be exposed from the resin layer 115 to the bottom surface side of the power module 300.

Moreover, in the power module 300 according to the third embodiment, a convex-shaped protruding portion (regulating portion) 201a for thickness control is formed at a periphery the exposed surface (contact surface) of the heat sink 32 on the bottom surface of the resin layer 115 facing to the cooling apparatus 210 so that protruding portion (regulating portion) 201a is protruded from the exposed surface, in the same manner as the above-mentioned second embodiment.

In the protruding portion 201a for thickness control, the spatial area to be embedded with a predetermined quantity of the thermally-conductive material (not shown) on the basis of the height (thickness) of the protruding portion 201a for thickness control at the time of connecting the power module 300 to the cooling apparatus is formed so that the exposed surface of the heat sink 32 becomes a concave region, on the bottom surface of the resin layer 115. Moreover, the discharge groove 205 for discharging an excessive thermally-conductive material 221 to an outside of the spatial area connecting the power module 300 to the cooling apparatus is formed on the protruding portion 201a for thickness control.

As shown in the second embodiment and the first to ninth modified examples thereof, the direction of the arranged discharge grooves 205 or the number of the discharge groove 205s are not limited.

Thus, heat of the power module 300 according to the third embodiment can also be effectively dissipated (the power module 300 can be effectively cooled) by efficiently conducting the heat generated from the MOSFETs (semiconductor devices) Q1 and Q4 from the heat sink 32 to the cooling apparatus via the thermally-conductive material.

More specifically, according to the power module according to the third embodiment 300, the distance between the heat sink 32 and the cooling apparatus (i.e., thickness of the thermally-conductive material) can be uniformly controlled in accordance with the thickness of the protruding portion 201a for thickness control. Accordingly, also when contacting the heat sink 32 to the cooling apparatus, reduction of the cooling performance due to unevenness of the thickness of the thermally-conductive material can be prevented. Accordingly, since the cooling (thermal dissipation) is sufficiently performed, it can suppress that the chip is broken down due to overheating or wiring is fused, and thereby the more reliable power module 300 can be provided.

In a case of the 2-in-1 module (module with the built-in half-bridge) 300 which has a simple structure and is capable of conducting large currents, a similar effect can be expected by forming at least three protruding portions 104 for thickness control as shown in the first embodiment and the first to third modified examples thereof, also when adopting the configuration of controlling the thickness of the thermally-conductive material.

(Examples of Power Module)

Hereinafter, there will now be explained examples of the power module according to the embodiments.

Figure 13A:
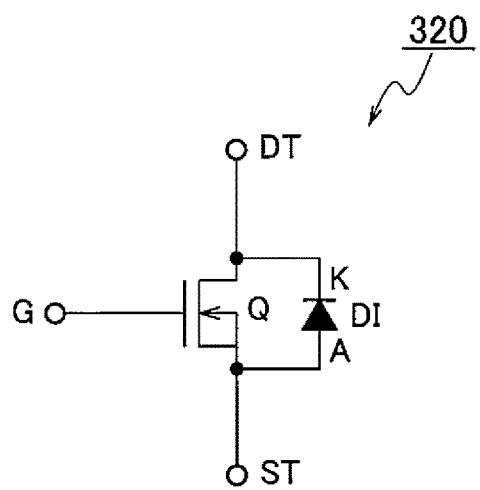
FIG. 13A is a circuit configuration diagram of a Silicon Carbide Metal Oxide Semiconductor Field Effect Transistor (SiC MOSFET), which is a power module (1-in-1 module) according to the embodiments.
Figure 13B:
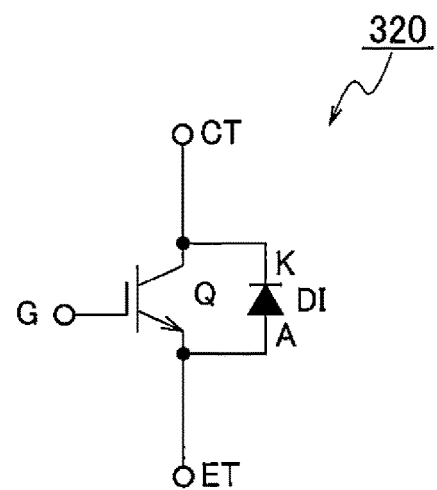
FIG. 13B is a circuit configuration diagram of an IGBT, which is a power module (1-in-1 module) according to the embodiments.

FIG. 13A shows a circuit representative of an SiC MOSFET of the 1-in-1 module, which is the power module 320 according to the embodiments. FIG. 13B shows a schematic circuit representation of the IGBT of the 1-in-1 module.

A diode DI connected in reversely parallel to the MOSFET Q is shown in FIG. 13A. A main electrode of the MOSFET Q is expressed with a drain terminal DT and a source terminal ST. Similarly, a diode DI connected in reversely parallel to the IGBT Q is shown in FIG. 13B. A main electrode of the IGBT Q is expressed with a collector terminal CT and an emitter terminal ET.

Figure 14:
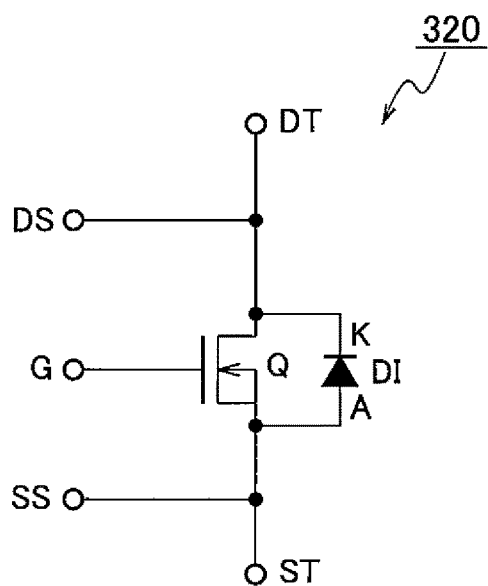
FIG. 14 is a detailed circuit configuration diagram of the power module (1-in-1 module (SiC MOSFET)) according to the embodiments.

Moreover, FIG. 14 shows a detailed circuit representative of the SiC MOSFET of the 1-in-1 module, which is the power module 320 according to the embodiments.

The power module 320 according to the embodiments includes a configuration of 1-in-1 module, for example. More specifically, one piece of the MOSFET Q is included in one module. As an example, five chips (MOSFET×5) can be mounted thereon, and a maximum of five pieces of the MOSFETs respectively can be connected to one another in parallel, as shown in FIG. 14. Note that it is also possible to mount a part of five pieces of the chips for the diode DI thereon.

The diode DI connected in reversely parallel between the source and the drain of the MOSFET Q is shown in FIG. 14. The diode DI is composed of a body diode or a discrete chip.

In FIG. 14, the main electrode of the MOSFET Q is expressed by the drain terminal DT and the source terminal ST as power terminals. Moreover, reference numeral SS denotes a source sense terminal, reference numeral DS denotes a drain sense terminal, and reference numeral G denotes a gate signal terminal, and each of terminals composes signal terminals.

Figure 15A:
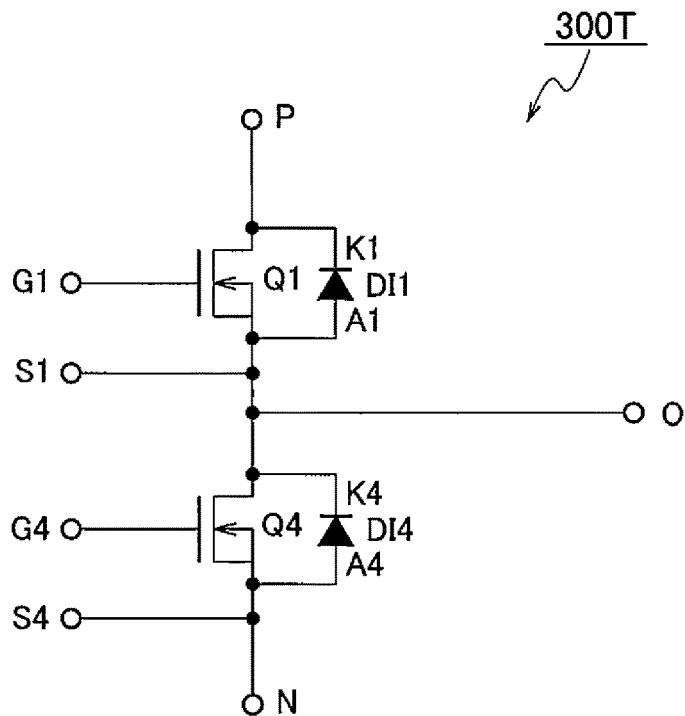
FIG. 15A is a circuit configuration diagram of an SiC MOSFET, which is a power module (2-in-1 module) according to the embodiments.

Moreover, FIG. 15A shows a circuit representative of the SiC MOSFET of the 2-in-1 module, which is the power module 300T according to the embodiments.

As shown in FIG. 15A, two MOSFETs Q1 and Q4, and diodes DI1 and DI4 connected in reversely parallel to the MOSFETs Q1 and Q4 are built in one module. Reference numeral G1 denotes a gate signal terminal of the MOSFET Q1, and reference numeral S1 denotes a source terminal of the MOSFET Q1. Reference numeral G4 denotes a gate signal terminal of the MOSFET Q4, and reference numeral S4 denotes a source terminal of the MOSFET Q4. Reference numeral P denotes a positive side power input terminal, reference numeral N denotes a negative side power input terminal, and reference numeral O denotes an output terminal.

Figure 15B:
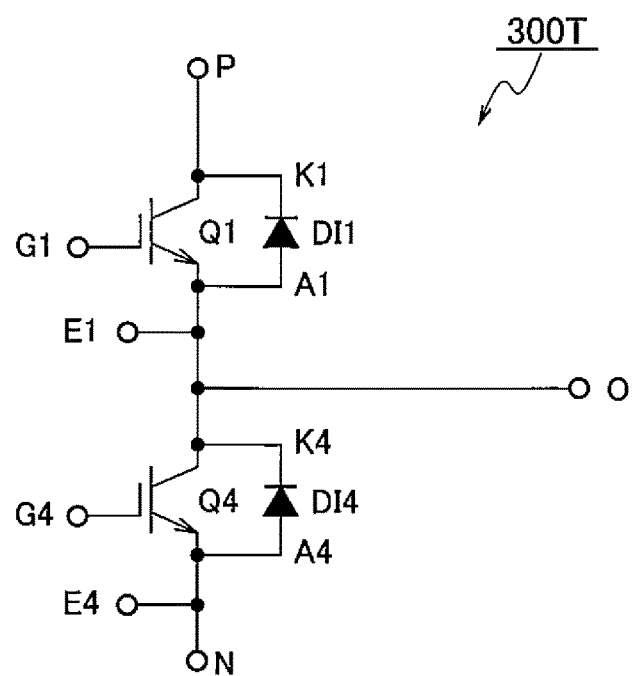
FIG. 15B is a circuit configuration diagram of an IGBT, which is a power module (2-in-1 module) according to the embodiments.

Moreover, FIG. 15B shows a circuit representative of the 2-in-1 module, which is the power module 300T according to the embodiments. As shown in FIG. 15B, two IGBTs Q1 and Q4, and diodes DI1 and DI4 connected in reversely parallel to the IGBTs Q1 and Q4 are built in one module. Reference numeral G1 denotes a gate signal terminal of the IGBT Q1, and reference numeral E1 denotes an emitter terminal of the IGBT Q1. Reference numeral G4 denotes a gate signal terminal of the IGBT Q4, and reference numeral E4 denotes an emitter terminal of the IGBT Q4. Reference numeral P denotes a positive side power input terminal, reference numeral N denotes a negative side power input terminal, and reference numeral O denotes an output terminal.

(Configuration Example of Semiconductor Device)

Figure 16A:
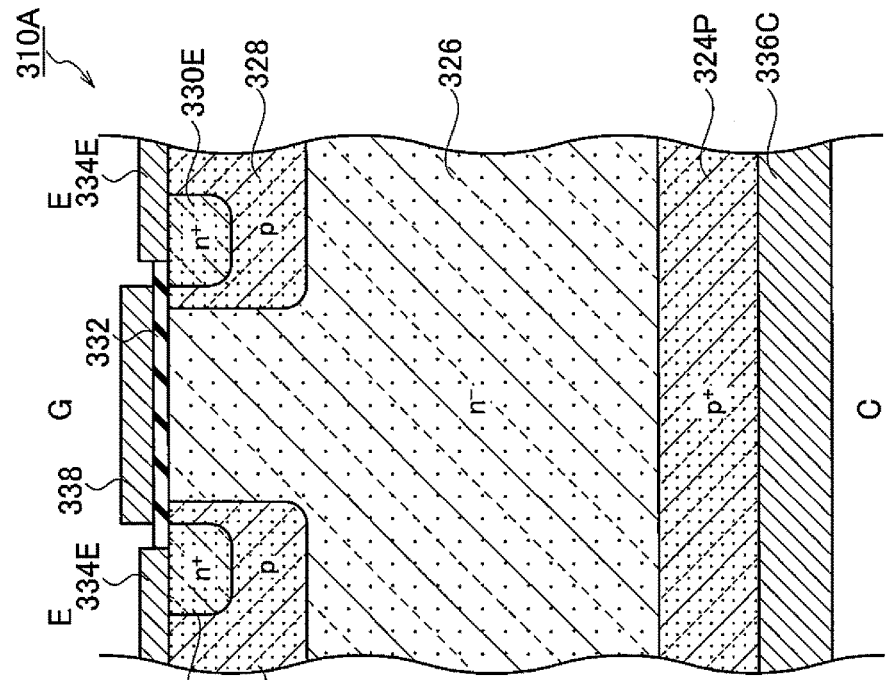
FIG. 16A is a schematic cross-sectional structure diagram of an SiC MOSFET, which is an example of a semiconductor device applied to the power module according to the embodiments.
Figure 16B:
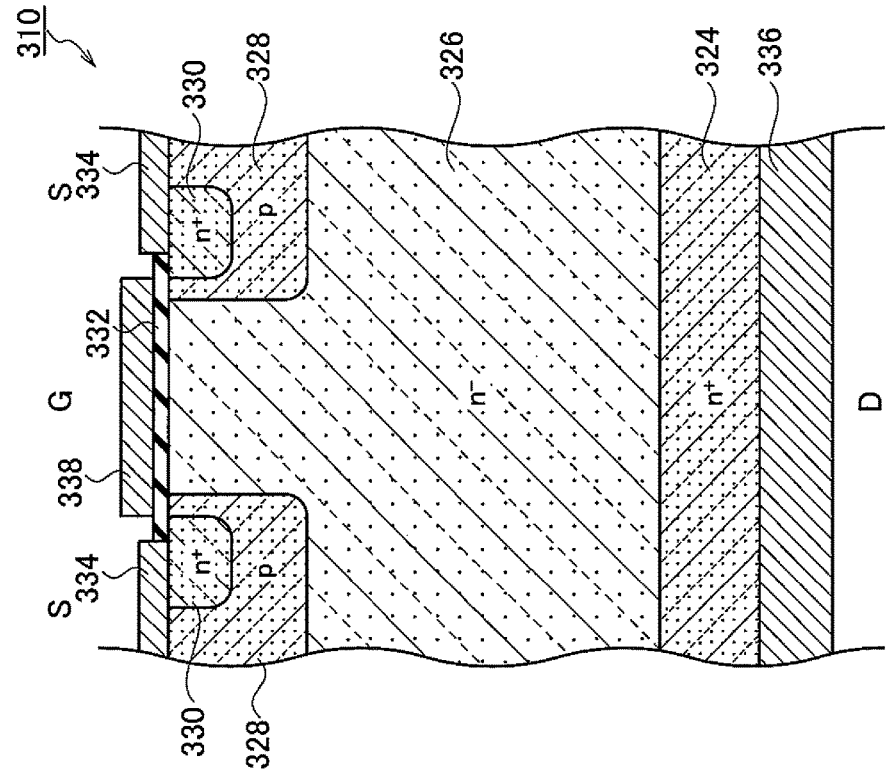
FIG. 16B is a schematic cross-sectional structure diagram of an IGBT, which is an example of a semiconductor device applied to the power module according to the embodiments.

FIG. 16A shows a schematic cross-sectional structure of an SiC MOSFET, which is an example of a semiconductor device which can be applied to the power module according to the embodiments, and FIG. 16B shows a schematic cross-sectional structure of the IGBT.

As shown in FIG. 16A, a schematic cross-sectional structure of the SiC MOSFET as an example of the semiconductor device 310 (Q) which can be applied to the power module according to the embodiments includes: a semiconductor substrate 326 composed by including an n− type high resistivity layer; a p body region 328 formed on a front surface side of the semiconductor substrate 326; a source region 330 formed on a front side surface of the p body region 328; a gate insulating film 332 disposed on a front side surface of the semiconductor substrate 326 between the p body regions 328; a gate electrode 338 disposed on the gate insulating film 332; a source electrode 334 connected to the source region 330 and the p body region 328; an n+ drain region 324 disposed on a back side surface opposite to the surface of the semiconductor substrate 326; and a drain electrode 336 connected to the n+ type drain area 324.

Although the semiconductor device 310 is composed by including a planar-gate-type n channel vertical SiC-MOSFET in FIG. 16A, the semiconductor device 310 may be composed by including an n channel vertical SiC-TMOSFET, etc., shown in FIG. 20 mentioned below.

Moreover, a GaN based FET etc. instead of SiC MOSFET can also be adopted to the semiconductor device (Q) 310 which can be applied to the power module according to the embodiments.

Any one of an SiC based power device, a GaN based power device, or an AlN based power device can be adopted to the semiconductor device 310 applicable to the power module according to the embodiments.

Furthermore, a semiconductor of which the bandgap energy is within a range from 1.1 eV to 8 eV, for example, can be used for the semiconductor device 310 applicable to the power module according to the embodiments.

Similarly, as shown in FIG. 16B, the IGBT as an example of the semiconductor device (Q) 310A applicable to the power module according to the embodiments includes: a semiconductor substrate 326 composed by including an n− type high resistivity layer; a p body region 328 formed on a front surface side of the semiconductor substrate 326; an emitter region 330E formed on a front side surface of the p body region 328; a gate insulating film 332 disposed on a front side surface of the semiconductor substrate 326 between the p body regions 328; a gate electrode 338 disposed on the gate insulating film 332; an emitter electrode 334E connected to the emitter region 330E and the p body region 328; a p+ collector region 324P disposed on a back side surface opposite to the surface of the semiconductor substrate 326; and a collector electrode 336 connected to the p+ collector region 324P.

In FIG. 16B, although the semiconductor device 310A is composed by including a planar-gate-type n channel vertical IGBT, the semiconductor device 310A may be composed by including a trench-gate-type n channel vertical IGBT, etc.

Figure 17:
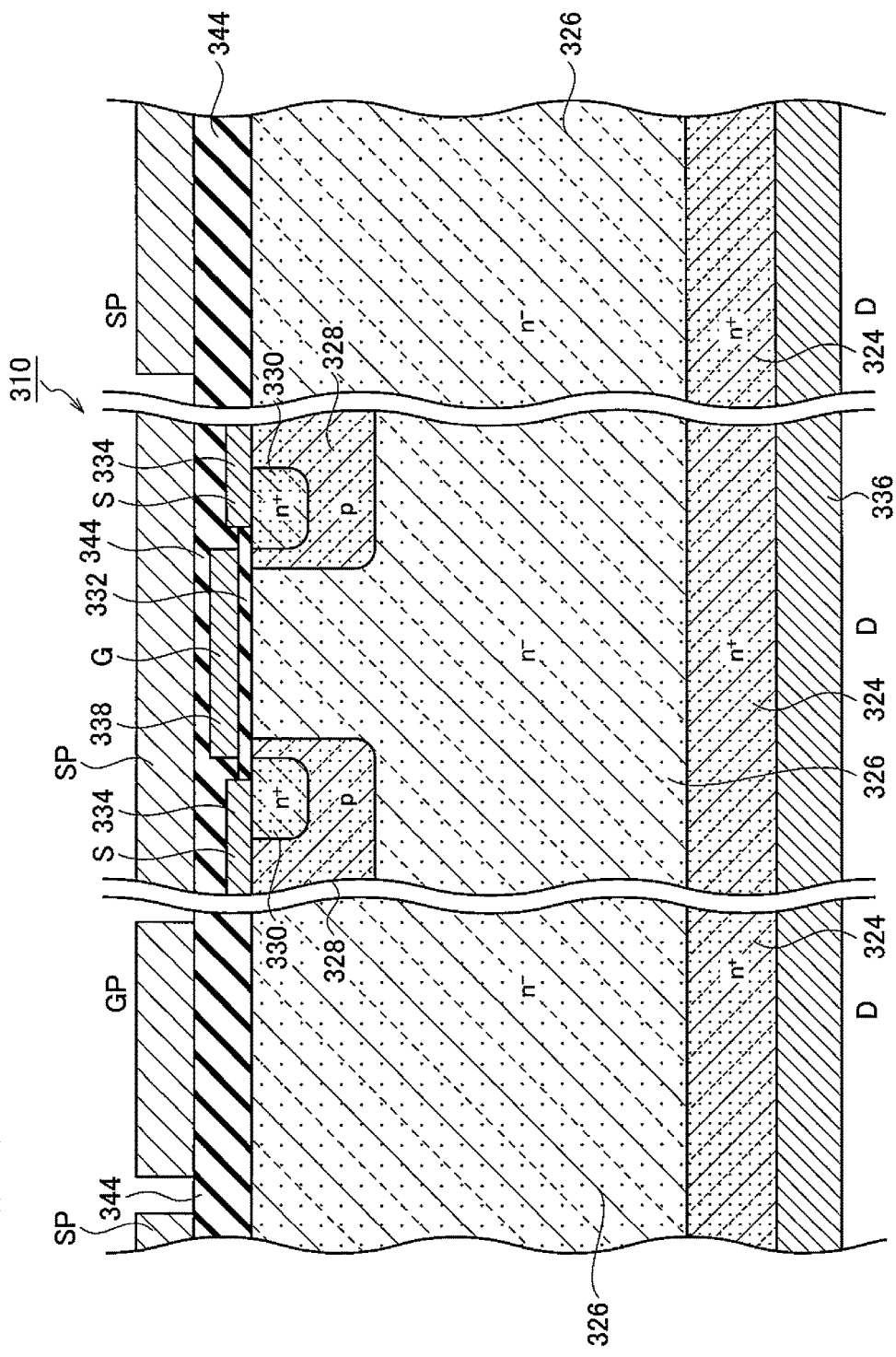
FIG. 17 is a schematic cross-sectional structure diagram of a semiconductor device (SiC MOSFET) to be applied to the power module according to the embodiments.

FIG. 17 shows a schematic cross-sectional structure of an SiC MOSFET including a source pad electrode SP and a gate pad electrode GP, which is an example of the semiconductor device 310 applicable to the power module according to the embodiments. The gate pad electrode GP is connected to the gate electrode 338 disposed on the gate insulating film 332, and the source pad electrode SP is connected to the source electrode 334 connected to the source region 330 and the p body region 328.

Moreover, as shown in FIG. 17, the gate pad electrode GP and the source pad electrode SP are disposed on an interlayer insulating film 344 for passivation which covers the surface of the semiconductor device 310. In addition, a microstructural transistor structure (not shown) may be formed in the semiconductor substrate 326 below the gate pad electrode GP and the source pad electrode SP in the same manner as the center portion shown in FIG. 16A.

Furthermore, as shown in FIG. 17, the source pad electrode SP may be disposed to be extended onto the interlayer insulating film 344 for passivation, also in the transistor structure of the center portion.

Figure 18:
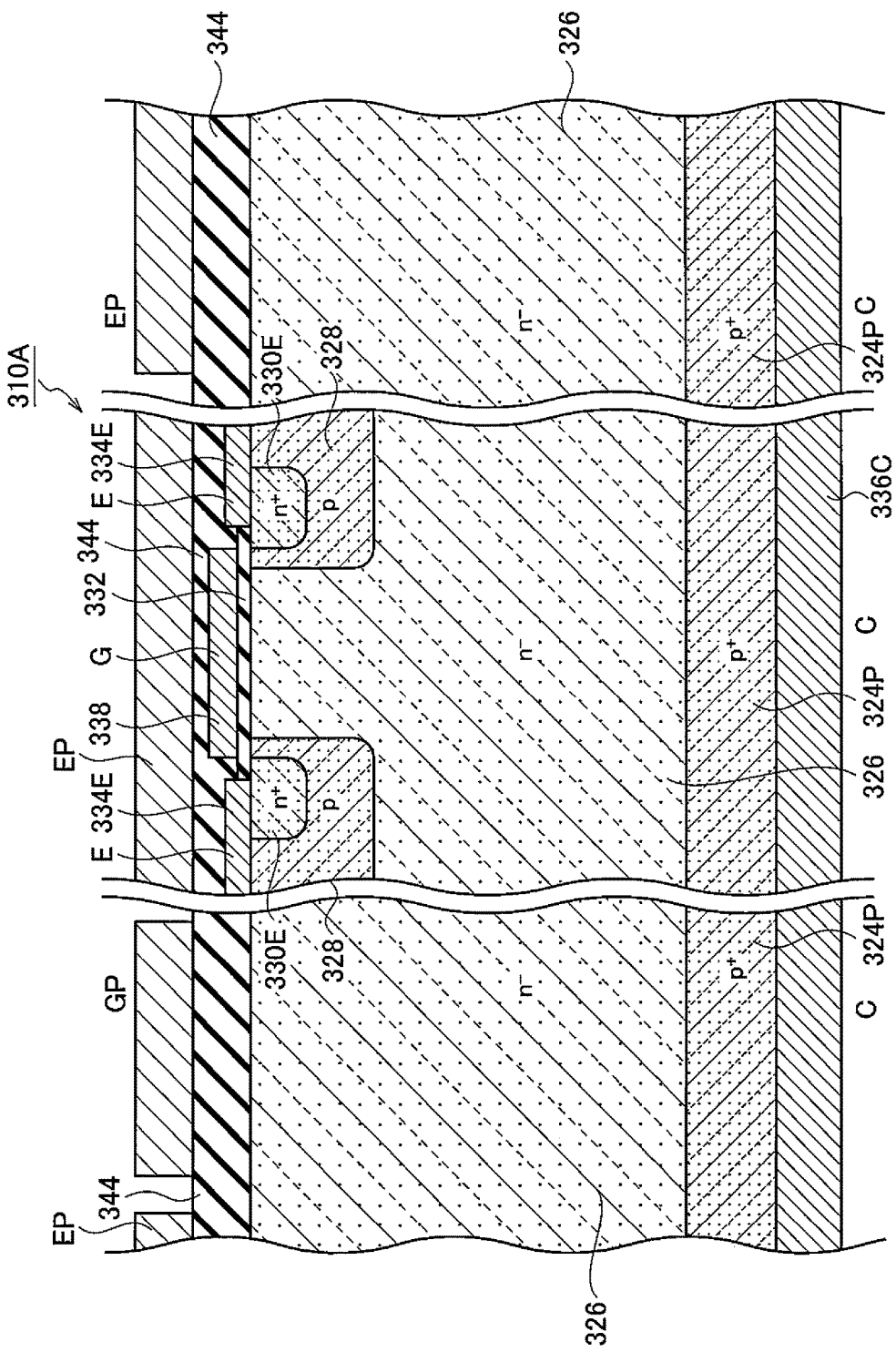
FIG. 18 is a schematic cross-sectional structure diagram of a semiconductor device (IGBT) to be applied to the power module according to the embodiments.

FIG. 18 shows a schematic cross-sectional structure of an IGBT including a source pad electrode SP and a gate pad electrode GP, which is an example of the semiconductor device 310A applied to the power modules 300 and 300T according to the embodiments. The gate pad electrode GP is connected to the gate electrode 338 disposed on the gate insulating film 332, and the emitter pad electrode EP is connected to the emitter electrode 334E connected to the emitter region 330E and the p body region 328.

Moreover, as shown in FIG. 18, the gate pad electrode GP and the emitter pad electrode EP are disposed on an interlayer insulating film 344 for passivation which covers the surface of the semiconductor device 310A. In addition, an IGBT transistor structure (not shown) may be formed in the semiconductor substrate 326 below the gate pad electrode GP and the emitter pad electrode EP in the same manner as the center portion shown in FIG. 16B.

Furthermore, as shown in FIG. 18, the emitter pad electrode EP may be disposed to be extended onto the interlayer insulating film 344 for passivation, also in the IGBT structure of the center portion.

—SiC DIMOSFET—

Figure 19:
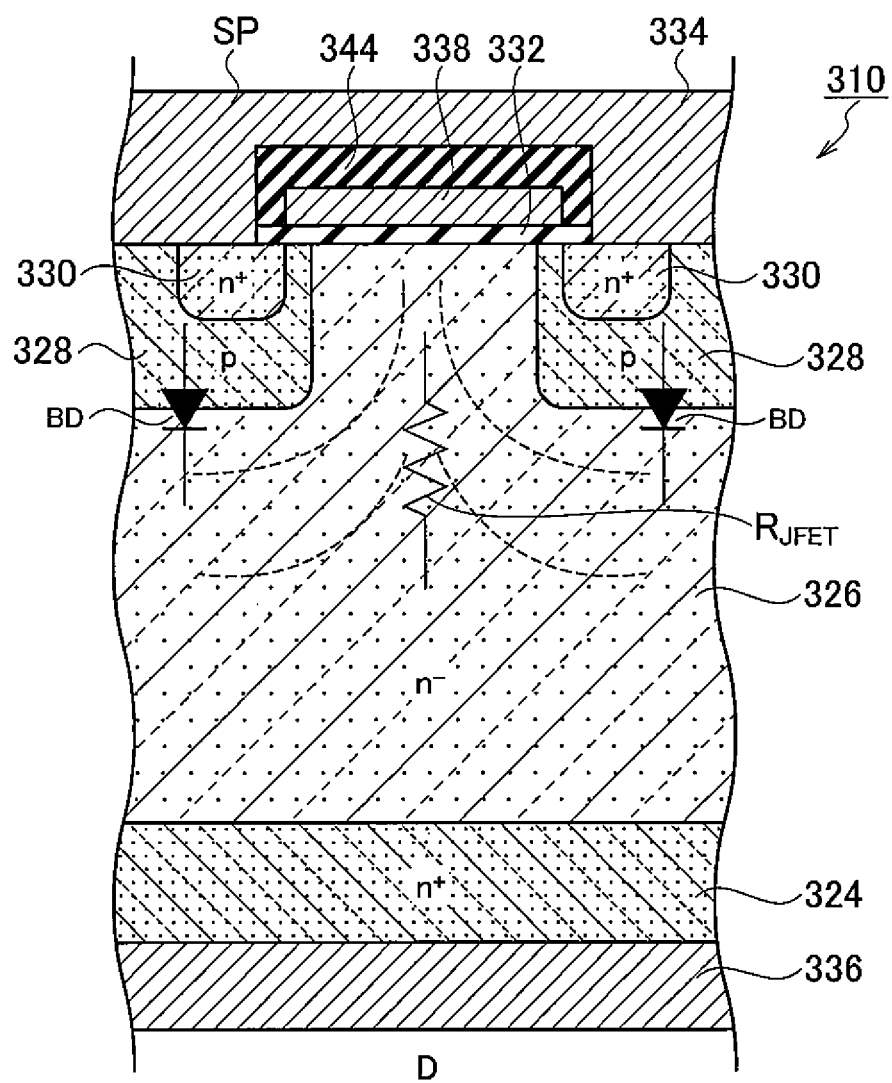
FIG. 19 is a schematic cross-sectional structure diagram of a semiconductor device (SiC Double Implanted MOSFET (SiC DIMOSFET)) applicable to the power module according to the embodiments.

FIG. 19 shows a schematic cross-sectional structure of an SiC DIMOSFET, which is an example of a semiconductor device 310 which can be applied to the power module according to the embodiments.

As shown in FIG. 19, the SiC DIMOSFET applicable to the power circuit according to the embodiments includes: a semiconductor substrate 326 composed of an n– type high resistivity layer; a p body region 328 formed on a front surface side of the semiconductor substrate 326; an n+ source region 330 formed on a front side surface of the p body region 328; a gate insulating film 332 disposed on a front side surface of the semiconductor substrate 326 between the p body regions 328; a gate electrode 338 disposed on the gate insulating film 332; a source electrode 334 connected to the source region 330 and the p body region 328; an n+ drain region 324 disposed on a back side surface opposite to the surface of the semiconductor substrate 326; and a drain electrode 336 connected to the n+ type drain area 324.

In the semiconductor device 310 shown in FIG. 19, the p body region 328 and the n+ source region 330 formed on the front side surface of the p body region 328 are formed with double ion implantation (DI), and the source pad electrode SP is connected to the source region 330 and the source electrode 334 connected to the p body region 328. A gate pad electrode GP (not shown) is connected to the gate electrode 338 disposed on the gate insulating film 332. Moreover, as shown in FIG. 19, the source pad electrode SP and the gate pad electrode GP (not shown) are disposed on an interlayer insulating film 344 for passivation configured to cover the front side surface of the semiconductor device 310.

As shown in FIG. 19, in the SiC DIMOSFET, since a depletion layer as shown with the dashed lines is formed in the semiconductor substrate 326 composed of a n– type high resistivity layer inserted into the p body regions 328, channel resistance $R_{JFET}$ accompanying the junction type FET (JFET) effect is formed. Moreover, as shown in FIG. 19, body diodes BD are respectively formed between the p body regions 328 and the semiconductor substrates 326.

—SiC TMOSFET—

Figure 20:
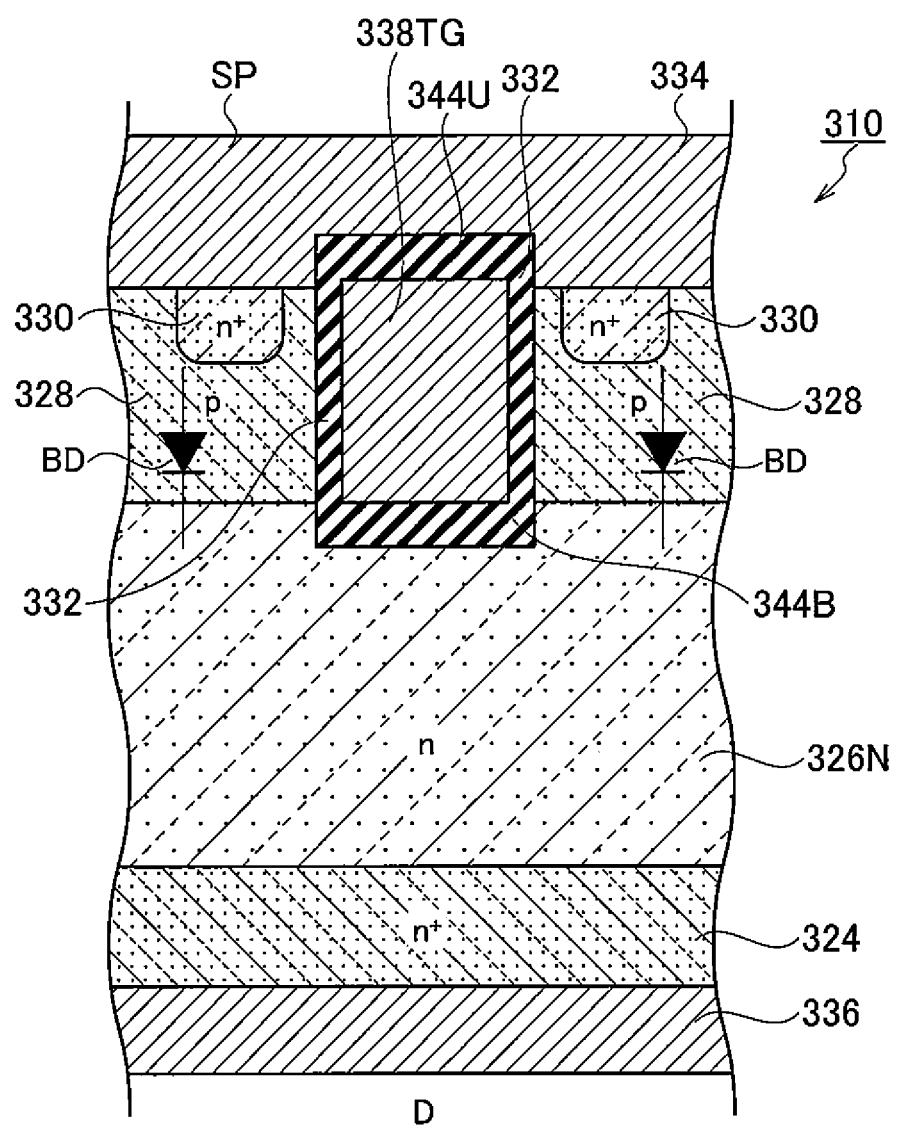
FIG. 20 is a schematic cross-sectional structure diagram of a semiconductor device (SiC Trench MOSFET (SiC TMOSFET)) applicable to the power module according to the embodiments.

FIG. 20 shows a schematic cross-sectional structure of an SiC TMOSFET, which is an example of a semiconductor device 310 which can be applied to the power module according to the embodiments.

As shown in FIG. 20, the SiC TMOSFET applicable to the power circuit according to the embodiments includes: a semiconductor substrate 326N composed of an n– type high resistivity layer; a p body region 328 formed on a front surface side of the semiconductor substrate 326N; an n+ source region 330 formed on a front side surface of the p body region 328; a trench gate electrode 338TG passing through the p body region 328, the trench gate electrode 338TG formed in the trench formed up to the semiconductor substrate 326N via the gate insulating film 332 and the interlayer insulating films 344U and 344B; a source electrode 334 connected to the source region 330 and the p body region 328; an n+ drain region 324 disposed on a back side surface opposite to the surface of the semiconductor substrate 326N; and a drain electrode 336 connected to the n+ type drain area 324.

In the semiconductor device 310 shown in FIG. 20, a trench gate electrode 338TG passes through the p body region 328, and the trench gate electrode 338TG formed in the trench formed up to the semiconductor substrate 326N is formed via the gate insulating film 332 and the interlayer insulating films 344U and 344B, and the source pad electrode SP is connected to the source region 330 and the source electrode 334 connected to the p body region 328. A gate pad electrode GP (not shown) is connected to the trench gate electrode 338TG disposed on the gate insulating film 332. Moreover, as shown in FIG. 20, the source pad electrode SP and the gate pad electrode GP (not shown) are disposed on an interlayer insulating film 344U for passivation configured to cover the front side surface of the semiconductor device 310.

In the SiC TMOSFET, channel resistance $R_{JFET}$ accompanying the junction type FET (JFET) effect as the SiC DIMOSFET is not formed. Moreover, body diodes BD are respectively formed between the p body regions 328 and the semiconductor substrates 326N, in the same manner as FIG. 19.

The power module according to the embodiment can be formed as any one selected from the group consist of 1-in-1 module, 2-in-1 module, 4-in-1 module, 6-in-1 module, and 7-in-1 module.

As explained above, according to the embodiments, the thickness of the thermally-conductive material for contacting between the heat sink and the cooling apparatus can be regulated in accordance with the thickness of the protruding portion for thickness control, and consequently there can be provided the reliable power module capable of securing sufficient cooling performance and capable of suppressing degradation due to overheating; the thermal dissipation structure of such a power module; and the contact method of such a power module.

Other Embodiments

As explained above, the embodiments have been described, as a disclosure including associated description and drawings to be construed as illustrative, not restrictive. This disclosure makes clear a variety of alternative embodiments, working examples, and operational techniques for those skilled in the art.

Such being the case, the embodiments cover a variety of embodiments, whether described or not.

INDUSTRIAL APPLICABILITY

The power module according to the embodiments can be used for manufacturing techniques for semiconductor modules, e.g. IGBT modules, diode modules, MOS modules (Si, SiC, GaN), etc., and can be applied to wide applicable fields, e.g. inverters for HEV/EV, inverter and converters for industrial applications, etc.

What is claimed is:

1. A power module in which a plurality of switching elements connected in series between a first power terminal and a second power terminal and a circuit configured to connect connecting points thereof to an output terminal are formed, the power module comprising:
   a heat radiation plate to which the switching elements are contacted;
   a sealing body configured to seal a perimeter of the plurality of switching elements and a part of each of the first and second power terminals and the output terminal so as to expose at least one portion of the heat radiation plate;

a regulating portion formed on the sealing body, the regulating portion configured to regulate a thickness of a thermally-conductive material when contacting the heat radiation plate to a cooling plate facing the heat radiation plate with the thermally-conductive material; and a protruding portion for positioning protruding from a center portion of the regulating portion, wherein the regulation portion and the protruding portion for positioning are cylindrical, and a diameter of the protruding portion for positioning is smaller than a diameter of the regulating portion.

2. The power module according to claim 1, wherein the regulating portion is formed at a periphery of the sealing body facing to the cooling plate, at the exposed surface side of the heat radiation plate.

3. The power module according to claim 1, wherein the regulating portion is formed at each of four corners of the sealing body facing to the cooling plate, at the exposed surface side of the heat radiation plate.

4. The power module according to claim 1, wherein the regulating portion is a convex region, and the number of the convex regions is at least three.

5. The power module according to claim 4, comprising at least three of the regulating portions and at least three of the protruding portions for positioning, each of the protruding portions for positioning protruding from the center portions of a respective one of the regulating portions.

6. The power module according to claim 4, wherein the convex region is configured to form a spatial area to be embedded with a predetermined quantity of the thermally-conductive material on the exposed surface of the heat radiation plate.

7. The power module according to claim 6, wherein the convex region comprises a discharge groove configured to discharge excessive amounts of the thermally-conductive material in the spatial area to an outside of the spatial area.

8. The power module according to claim 7, wherein the discharge groove is formed in at least any one direction of a first direction orthogonal to a direction to face the cooling plate of the sealing body, a second direction different from the first direction, or a third direction different from the first direction and the second direction.

9. The power module according to claim 1, wherein the regulating portion is a cylindrical-shaped or prismatic-shaped regulating portion.

10. The power module according to claim 1, wherein the regulating portion is configured to form a spatial area for interposing a predetermined quantity of the thermally-conductive material on the exposed surface of the heat radiation plate.

11. The power module according to claim 1, wherein the regulating portion is a convex region which is disposed so that the regulating portion is protruded from the exposed surface of the heat radiation plate.

12. The power module according to claim 1, wherein the switching element is mounted on a circuit substrate, wherein a principal element of wiring of the circuit substrate is any one of copper, a copper alloy, aluminum or an aluminum alloy.

13. The power module according to claim 1, wherein the switching element is mounted on a circuit substrate, the circuit substrate composed by including contacted bodies of metal/ceramics/metal.

14. The power module according to claim 1, wherein a coefficient of thermal conductivity of the thermally-conductive material is within a range of 0.5 W/mK to 300 W/mK.

15. The power module according to claim 14, wherein the thermally-conductive material is an organic material of any one of an epoxy resin, an acrylic resin, a silicone resin, a urethane resin, or polyimide.

16. The power module according to claim 14, wherein the thermally-conductive material is a synthetic resin with which a metal powder or a ceramic powder is mixed by an organic material of any one of an epoxy resin, an acrylic resin, a silicone resin, a urethane resin, or polyimide.

17. The power module according to claim 14, wherein the thermally-conductive material is a solder cured by heating or firing silver.

18. The power module according to claim 1, wherein the switching element comprises any one of an IGBT, a diode, an Si based MOSFET, an SiC based MOSFET and a GaNFET; or a plurality of the elements.

19. The power module according to claim 1, wherein
the first and second power terminals and the output terminal are respectively exposed from opposite side surfaces of the sealing body, each of the first and second power terminals and the output terminal is exposed at a height different from a height of an exposed surface of the heat radiation plate of the sealing body, and each of the first and second power terminals and the output terminal is exposed at a height different from a height of a surface opposite to the exposed surface of the sealing body.

20. The power module according to claim 1, wherein
a height of the regulating portion is substantially the same as a thickness of the thermally-conductive material, and
a height of the protruding portion for positioning is higher than the thickness of the thermally-conductive material.

21. A thermal dissipation structure of a power module, the thermal dissipation structure comprising:
a semiconductor device;
a heat radiation plate to which the semiconductor device is contacted;
a sealing body configured to seal a perimeter of the semiconductor device so as to expose at least one portion of the heat radiation plate;
first and second power terminals and an output terminal connected to an electrode of the semiconductor device, the first and second power terminals and the output terminal exposed from opposite side surfaces of the sealing body, each of the first and second power terminals and the output terminal being exposed at a height different from a height of an exposed surface of the heat radiation plate of the sealing body, each of the first and second power terminals and the output terminal being exposed at a height different from a height of a surface of the sealing body opposite to the exposed surface of the heat radiation plate of the sealing body;
a cooling plate to which the heat radiation plate exposed from the sealing body is contacted via a thermally-conductive material, the cooling plate facing the heat radiation plate;
a regulating portion formed on the sealing body, the regulating portion configured to regulate a thickness of the thermally-conductive material so as to become uniform and
a protruding portion for positioning protruding from a center portion of the regulating portion, wherein
the regulating portion is a square-shaped or circle-shaped convex region which is disposed so as to surround a periphery of the heat radiation plate, the convex region is configured to form a spatial area to be embedded with a predetermined quantity of the thermally-conductive material on the exposed surface of the heat radiation plate, the convex region comprises a discharge groove configured to discharge excessive amounts of the thermally-conductive material in the spatial area to an outside of the spatial area, and a diameter of the protruding portion for positioning is smaller than a diameter of a thickness of the regulating portion.

22. The thermal dissipation structure of the power module according to claim 21, wherein the discharge groove is formed in at least any one direction of a first direction orthogonal to a direction to face the cooling plate of the sealing body, a second direction different from the first direction, or a third direction different from the first direction and the second direction.

23. The thermal dissipation structure of the power module according to claim 21, wherein the thermally-conductive material overflows to an outside of the discharge groove of the sealing body.

24. The power module according to claim 1, further comprising a plurality of control terminals, wherein
the control terminals are respectively exposed opposite side surfaces of the sealing body deferent from the opposite side surfaces from which each of the first and second power terminals and the output terminal is exposed.

25. The thermal dissipation structure of the power module according to claim 21, the power module further comprising a plurality of control terminals, wherein
the control terminals are respectively exposed from opposite side surfaces of the sealing body different from the opposite side surfaces from which each of the first and second power terminals and the output terminal is exposed.

26. The thermal dissipation structure of the power module according to claim 21, wherein
a height of the regulating portion is substantially the same as a thickness of the thermally-conductive material, and
a height of the protruding portion for positioning is higher than the thickness of the thermally-conductive material.

* * * * *